(12) United States Patent
Takahashi et al.

(10) Patent No.: US 7,738,845 B2
(45) Date of Patent: Jun. 15, 2010

(54) ELECTRONIC PARTS FOR HIGH FREQUENCY POWER AMPLIFIER AND WIRELESS COMMUNICATION DEVICE

(75) Inventors: Kyoichi Takahashi, Tokyo (JP); Nobuhiro Matsudaira, Yokohama (JP); Takashi Yokoi, Yokohama (JP)

(73) Assignees: Renesas Technology, Tokyo (JP); Hitachi Hybrid Network Co., Ltd., Kanagawa (JP)

( * ) Notice: Subject to any disclaimer, the term of this patent is extended or adjusted under 35 U.S.C. 154(b) by 937 days.

(21) Appl. No.: 11/524,380

(22) Filed: Sep. 21, 2006

(65) Prior Publication Data

US 2007/0066250 A1    Mar. 22, 2007

(30) Foreign Application Priority Data

Sep. 22, 2005   (JP)   ............................. 2005-274822
Feb. 28, 2006   (JP)   ............................. 2006-052115

(51) Int. Cl.
   *H01Q 11/12*   (2006.01)
   *H04B 1/04*    (2006.01)

(52) U.S. Cl. .................................. 455/126; 455/127.2

(58) Field of Classification Search ................ 455/126, 455/127.1, 127.2, 127.3; 375/297; 330/278, 330/291, 295
   See application file for complete search history.

(56) References Cited

U.S. PATENT DOCUMENTS 5,852,770 A * 12/1998 Kasamatsu .................. 455/126

| 6,526,266 | B1 | 2/2003 | Obara et al. |
| 6,625,429 | B1 | 9/2003 | Yamashita et al. |
| 2004/0162039 | A1* | 8/2004 | Marque-Pucheu .......... 455/126 |
| 2005/0287966 | A1* | 12/2005 | Yoshimi et al. .......... 455/127.1 |

FOREIGN PATENT DOCUMENTS

| JP | 11-177444 | 7/1999 |
| JP | 2001-16116 | 1/2001 |

* cited by examiner

*Primary Examiner*—Nguyen Vo
(74) *Attorney, Agent, or Firm*—Mattingly & Malur, P.C.

(57) ABSTRACT

The present invention provides electronic parts for amplifying high frequency power capable of expanding a dynamic range of an output power detection circuit, obtaining a continuous detection output having no inflexion point from a low region of output power to its high region and thereby improving controllability of the output power. In a wireless communication system which controls output power of a high frequency power amplifier, based on an output power detection signal and a signal indicative of an output level, an output power detection circuit is provided with a multi-stage configured amplifier which amplifies a high frequency signal taken out via a coupler and capacitive elements. Further, a plurality of detection circuits which detect outputs of amplifiers of respective stages, and a detection circuit which detects the high frequency signal without passing through the multi-stage configured amplifier are provided. One obtained by combining the outputs of these detection circuits is inputted to an error amplifier for generating an output power control signal, as the output power detection signal to thereby generate a control signal for the high frequency power amplifier.

8 Claims, 13 Drawing Sheets

ELECTRONIC PARTS FOR HIGH FREQUENCY POWER AMPLIFIER AND WIRELESS COMMUNICATION DEVICE

CROSS-REFERENCE TO RELATED APPLICATION

The present application claims priority from Japanese patent applications No. 2006-52115 filed on Feb. 28, 2006 and No. 2005-274822 filed on Sep. 22, 2005, the content of which is hereby incorporated by reference into this application.

BACKGROUND OF THE INVENTION

The present invention relates to a technique for expanding a dynamic range of an output detection circuit in high frequency power amplifying electronic parts (RF power module) with a high frequency power amplifier built therein and enhancing controllability of output power, and to a technique effective if applied to, for example, an RF power module used in a cellular phone and a wireless communication device using the same.

An RF power module having built therein a high frequency power amplifier (PA) in which transistors such as MOSFETs (Metal Oxide Semiconductor Field-Effect-Transistor), GaAs-MESFETs, etc. is incorporated in a transmission output section of a wireless communication device (mobile communication device) such as a cellular phone, etc.

In a cellular phone, a system is generally configured in such a manner that a phone call is made while output power is changed in accordance with transmission power indication information sent from a base station so as to adapt to an ambient environment and interference is avoided between the cellular phone and other cellular phones. In a GSM (Global System for Mobile Communication) type cellular phone, for example, an output power detection signal and an output level indication signal Vramp outputted from a baseband circuit are compared with each other by an APC (Automatic Power Control) made up of an error amplifier and the like to thereby generate a control voltage Vapc for controlling the output power.

Then, the gain of each amplifying stage of a high frequency power amplifier of a transmission output section has been controlled by a bias circuit so as to reach output power necessary for a call by the control voltage Vapc.

SUMMARY OF THE INVENTION

A problem arises in that since the sensitivity of an output power detection circuit in a region low in output power is relatively low upon output power control for the conventional cellular phone, controllability of the output power at low output power is not satisfactory. Therefore, there has been proposed the invention in which a system for controlling output power in a region high in output power and a system for controlling output power in a region low in output power are made different from each other (refer to a patent document 1 (Japanese Unexamined Patent Publication No. Hei 11(1999)-177444). There has also been proposed the invention in which the dynamic range of a detection circuit is expanded by making the combined adoption of two of a high sensitivity detector and a low sensitivity detector (refer to a patent document 2 (Japanese Unexamined Patent Publication No. 2001-016116).

In the invention of the patent document 1, an output power control loop is made off where the output power is lower than a given level, thereby to control the output power according to a transmission power indication value given from outside. When the output power is higher than the given level, the output power control loop is made on to perform switching to automatic transmission power control by a feedback loop. Therefore, it is not possible to avoid the occurrence of a response delay upon control loop switching. As a result, there is a fear that a switching spectrum at so-called ramp-up that the output power is raised to a desired level upon a transmission start is deteriorated.

In the invention of the patent document 2, the high sensitivity detector is provided with a limiter. When the output power is lower than a given level B, the output of the high sensitivity detector is supplied to a comparator (error amplifier). When the output power becomes higher than a given level A (A<B), the low sensitivity detector starts it output. When the output power reaches the level B, the output of the high sensitivity detector is limited. Therefore, a problem arises in that the inflection point that the tilt of a detection voltage varies suddenly occurs in the neighborhood of switching from the output of the high sensitivity detector to the output of the low sensitivity detector, so that control on the output power cannot be performed smoothly.

Further, the cellular phone is configured in such a manner that a high frequency signal taken out from the output side of a high frequency power amplifier by a directional power coupler called a coupler in general is inputted to its corresponding detection circuit, where output power is detected. As the present coupler, one configured as a discrete part is also known. However, in order to miniaturize a module and a device, a built-in coupler (hereinafter called microcoupler) constituted of a conductive pattern formed in a module substrate has been used. Incidentally, a variation in characteristic due to variations in manufacture is not so large in such a microcoupler.

In the RF power module using the microcoupler, however, the pattern shape and size of the coupler are often changed between products different in spec due to the design reason (reflected-wave characteristic in particular). The present inventors have found out a problem that a difference occurs in a coupling loss, i.e., attenuation of the high frequency signal as seen from a power amplifier due to the difference in configuration between the microcouplers, and hence even though detection circuits identical in construction are used, variations occur in the input dynamic range of the detection circuit.

Incidentally, the dynamic range of the detection circuit can be adjusted by changing the gain or the like of each amplifier inside the detection circuit. In order to perform its adjustment, however, there is a need to change the design of the detection circuit. There is a problem that there is a fear that when the gain or the like of each amplifier inside the detection circuit is simply changed, the detection sensitivity in the low power region is deteriorated.

An object of the present invention is to provide high frequency power amplifying electronic parts (RF power module) capable of expanding a dynamic range of an output power detection circuit, obtaining a continuous detection output having no inflexion point from a region low in output power to a region high in output power and thereby enhancing controllability of output power.

Another object of the present invention is to provide high frequency power amplifying electronic parts (RF power module) capable of enhancing controllability of output power in a region low in output power without deteriorating a switching spectrum at the rise of the output power at the start of transmission.

A further object of the present invention is to provide high frequency power amplifying electronic parts capable of aligning a dynamic range of an output power detection circuit with a desired range without reducing detection sensitivity in a low power region and making a circuit design change even though power couplers used in the detection of output power are different in shape and size.

The above, other objects and novel features of the present invention will become apparent from the description of the specification and the accompanying drawings.

Summaries of typical or representative ones of the inventions disclosed in the present application will be explained as follows:

In a wireless communication system which controls output power of a high frequency power amplifier on the basis of an output power detection signal and a signal indicating an output level, an output power detection circuit is provided with a multi-stage configured amplifier which amplifies a high frequency signal taken out or extracted via a coupler and capacitive elements. A plurality of detection circuits which respectively detect outputs of amplifiers of respective stages in the multi-stage configured amplifier, and a detection circuit which detects the high frequency signal unpassed through the multi-stage configured amplifier are provided. One obtained by combining the outputs of these detection circuits is inputted as the output power detection signal to an error amplifier for generating an output power control signal, thereby generating a control signal for the high frequency power amplifier.

Further, the gains of both the amplifiers of the respective stages and the respective detection circuits are suitably designed respectively in such a manner that the output of the detection circuit corresponding to the first-stage amplifier of the multi-stage configured amplifier is saturated in a region high in output power, the output of the detection circuit corresponding to the final-stage amplifier is saturated in a region low in output power, and the output of the detection circuit corresponding to the middle-stage amplifier is saturated in a middle power region. Effective detection ranges in which the outputs of the detection circuits in the respective stages are not saturated are caused to overlap one another.

According to the above means, the high frequency signal taken out via the coupler or the like is amplified by the multi-stage configured amplifier before its detection. Therefore, the sensitivity of the output power detection circuit in the region low in output power is improved. The detection circuits corresponding to the post-stage ones in the multi-stage configured amplifier, of the plurality of detection circuits are configured so as to be saturated in output in the region low in output power. The effective detection ranges of the detection circuits in the respective stages are caused to overlap one another, whereby a continuous detection output can be obtained from the region low in output power to the region high in output power.

That is, the dynamic range can be expanded while the sensitivity of the output power detection circuit in the region low in output power is being improved. It is therefore possible to enhance controllability of the output power. Since there is no need to off-control a feedback loop even in the region low in output power, a switching spectrum at the rise of the output power at the start of transmission is not deteriorated and controllability of the output power in the region low in output power can be enhanced.

Preferably, the amplifiers in the multi-stage configured amplifier are constituted of common-source transistors respectively. When the multi-stage configured amplifier is configured of a differential amplifier, the circuit becomes easy to oscillate and the exclusively-possessed area of the circuit also becomes larger. However, the exclusively-possessed area of the circuit can be reduced while preventing oscillations by configuring the amplifiers by the common-source transistors and suppressing the gain. Since a CMOS process is necessary when the multi-stage configured amplifier is constituted of the differential amplifier, an increase in cost is incurred when it is configured as a semiconductor integrated circuit of one chip together with the high frequency power amplifier made up of N channel MOSFETs. However, the use of the common-source transistors makes it easy to provide one chipping while the rise in cost is being avoided.

Further, another invention of the present application is configured in such a manner that a first detection circuit which detects a high frequency signal RFin taken out from the output of each power amplifier without amplifying it, and a second detection circuit which includes a multi-stage configured amplifier and amplifies and detects a low power signal stepwise are provided, and their outputs are added together to obtain a detection output. An attenuator is provided on the input side of the first detection circuit. Thus, the attenuation of the attenuator is adjusted and the detection sensitivity of a mid-high power region is changed, thereby making it possible to adjust the dynamic range of each detection circuit without degrading detection sensitivity at low power.

Here, preferably, a plurality of capacitive elements or resistive elements are formed on a semiconductor chip as the attenuator in advance. Each element to be connected according to the presence or absence of the formation of wiring by master slices is selected thereby to make it possible to adjust the attenuation. Thus, since the dynamic range of the detection circuit can be changed by simply changing a mask used for the formation of the wiring pattern, there is no need to make a design change in circuit.

Advantageous effects obtained by representative ones of the inventions disclosed in the present application will briefly be explained as follows:

High frequency power amplifying electronic parts (RF power module) can be realized which is capable of expanding a dynamic range of an output power detection circuit and obtaining a continuous detection output with no inflection point from a region low in power to a region high in power, thereby making it possible to enhance controllability of output power.

High frequency power amplifying electronic parts can be implemented which is capable of aligning a dynamic range of an output power detection circuit with a desired range without reducing detection sensitivity in a low power region and making a circuit design change even though power couplers used in the detection of output power are different in shape and size.

BRIEF DESCRIPTION OF THE DRAWINGS

FIG. 6 is a graph depicting the relationship between output power Pout of the RF power module according to the embodiment and a detection voltage VDET of a power detection circuit and the like;

DETAILED DESCRIPTION OF THE PREFFERED EMBODIMENTS

Preferred embodiments of the present invention will hereinafter be described based on the accompanying drawings.

Figure 1:
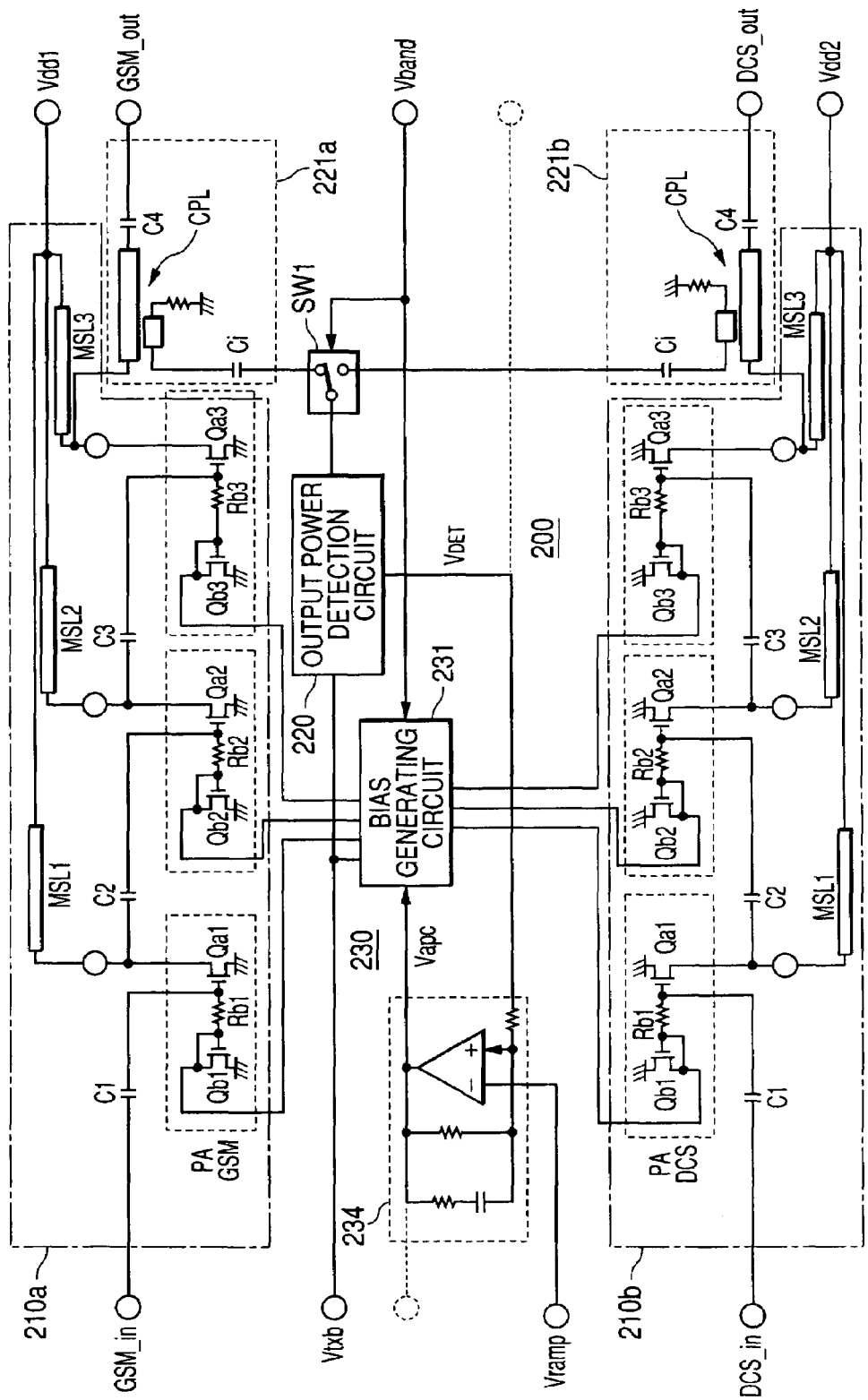
FIG. 1 is a block diagram showing one embodiment of a high frequency power amplifier (RF power module) according to the present invention.

FIG. 1 shows one embodiment of a high frequency power amplifier including a high frequency power amplifier circuit which amplifies a transmit signal having a high frequency, and an output power control circuit which controls the gain of the high frequency power amplifier circuit in response to a detected output of an output power detection circuit which detects the level of power outputted from the high frequency power amplifier circuit. The high frequency power amplifier according to the embodiment is configured so as to be capable of power-amplifying transmit signals of two systems corresponding to a GSM using a 800 MHz band and a DCS (Digital Cellular System) using a 1900 MHz band according to modes respectively and outputting the power-amplified signals.

The high frequency power amplifier according to the embodiment comprises high frequency power amplifier circuits 210a and 210b, an output power detection circuit (detection or detector circuit) 220, an output power control circuit 230, etc. These circuits are formed as one or two or more ICs (semiconductor integrated circuits). The high frequency power amplifier is configured as a module with such ICs being mounted onto an insulated board together with external elements such as capacitors, resistors, etc.

In the present specification, one configured as if to be treated as one electronic part by mounting a plurality of semiconductor chips and discrete parts onto an insulated board like a ceramic substrate with printed wirings given to its surface and inside and coupling the respective parts by means of the printed wirings and bonding wires such that they act as predetermined roles, is referred to as a module. The moduled high frequency power amplifier according to the embodiment is called an RF power module.

The RF power module 200 according to the present embodiment is provided with the high frequency power amplifier circuit 210a for GSM and the high frequency power amplifier circuit 210b for DCS. The amplifier circuits 210a and 210b for GSM and DCS are respectively provided with output extracting means 221a and 221b comprising couplers CPL and capacitive elements Ci in association with each other. The output power detection circuit 220 and the output power control circuit 230 are provided as circuits common to the amplifier circuits 210a and 210b except for the output extracting means 221a and 221b.

The module 200 is provided with a bias generating circuit 231 which generates bias currents of amplifying transistors lying in the high frequency power amplifier circuits 210a and 210b, and an error amplifier 234 which compares a detection voltage VDET outputted from the output power detection circuit 220 and an output indication signal Vramp outputted from a baseband circuit and generates a control signal Vapc corresponding to the difference in potential therebetween and supplies the same to the bias generating circuit 231.

As the coupler CPL lying in each of the output extracting means 221a and 221b, a microcoupler can be used which utilizes a capacitance or capacitor formed between an output line constituted of a microstripline on the insulated board connected to an output terminal of the power amplifier circuit and a relatively short microstripline disposed in parallel.

Although the high frequency power amplifier circuits 210a and 210b for GSM and DCS are identical in configuration, the bias currents of the internal amplifying transistors differ according to whether a transmit signal to be amplified is a signal for GSM or a signal for DCS. Therefore, the bias generating circuit 231 is switch-controlled by a band control signal Vband indicative of whether a transmission mode supplied from the baseband circuit corresponds to GSM or DCS.

Further, the bias generating circuit 231 generates and supplies a bias current for the high frequency power amplifier circuit 210a according to the control voltage Vapc in the transmission mode for GSM and generates and supplies a bias current for the high frequency power amplifier circuit 210b in the transmission mode for DCS. As the bias generating circuit 231, a circuit which has a configuration similar to a circuit comprising an operational amplifier OP1 lying in a bias current generating circuit 225 shown in FIG. 8 to be described later, transistors Q11 through Q14 constituted of MOSFETs that receive the output of the operational amplifier OP1 at their gate terminals, and a resistor R11 connected in series with the transistor Q11 and which is configured in such a manner that the control voltage vapc is inputted to the operational amplifier OP1 in place of a constant voltage Vc1, can be used.

Each of the high frequency power amplifier circuit 210a for GSM and the high frequency power amplifier circuit 210b for DCS is configured as a three-stage type amplifier circuit in which three amplifying transistors Qa1, Qa2 and Qa3 are cascade-connected, i.e., they are connected in such a manner that the output at a drain terminal of the pre-stage transistor is inputted to a gate terminal used as a control terminal of the post-stage transistor. Although not restricted in particular, LDMOSs (Laterally Diffused MOSFETs) corresponding to MOSFETs each having a relatively high source-to-drain withstand voltage (about 20V), in which electrodes are diffused in the lateral direction on the corresponding semiconductor chip, are used as the ampliying transistors Qa1, Qa2 and Qa3. Inductors MSL1, MSL2 and MSL3 each constituted of a microstripline formed on a module's substrate are connected between the drain terminals of the amplifying transistors QA1, Qa2 and Qa3 of the respective amplifying stages and each of power supply voltage terminals Vdd1 and Vdd2.

Further, capacitors C1, C2 and C3 for cutting off dc components of a high frequency signal to be amplified are provided between the respective amplifying stages of the high frequency power amplifier circuits 210a and 210b. And the drain terminal of the final-stage amplifying transistor Qa3 is connected to an output terminal via a capacitor C4. Bias transistors Qb1, Qb2 and Qb3 constituted of LDMOSs whose gate terminals are respectively connected to those of the amplifying transistors QA1, Qa2 and Qa3 via resistors Rb1, Rb2 and Rb3 are provided in the respective amplifying stages. The transistors QA1 and Qb1, Qa2 and Qb2 and Qa3 and Qb3 respectively constitute current mirror circuits. Bias currents Ib1, Ib2 and Ib3 are supplied to the transistors Qb1, Qb2 and Qb3 by the bias generating circuit 231, so that biases are applied to the amplifying transistors QA1, Qa2 and Qa3, whereby operating currents corresponding to the power control voltage Vapc are caused to flow.

Incidentally, although the bias generating circuit 231 is configured as the circuit that supplies the biases to the amplifying transistors QA1, Qa2 and Qa3 in accordance with the current mirror system in the present embodiment, it may be configured of a resistance divider circuit which divides Vapc at a suitable ratio and applies the same to the gate terminals of the amplifying transistors in the respective stages as bias voltages. Although the bias transistors Qb1, Qb2 and Qb3 are shown in FIG. 1 so as to be included in the high frequency power amplifier circuits 210a and 210b, the transistors Qb1, Qb2 and Qb3 and the bias generating circuit 231 can also be regarded as having constituted the bias circuit. Although the high frequency power amplifier circuits 210a and 210b are respectively constituted of the amplifying stages corresponding to the three stages in the present embodiment, the number of stages may be one or two.

Figure 2:
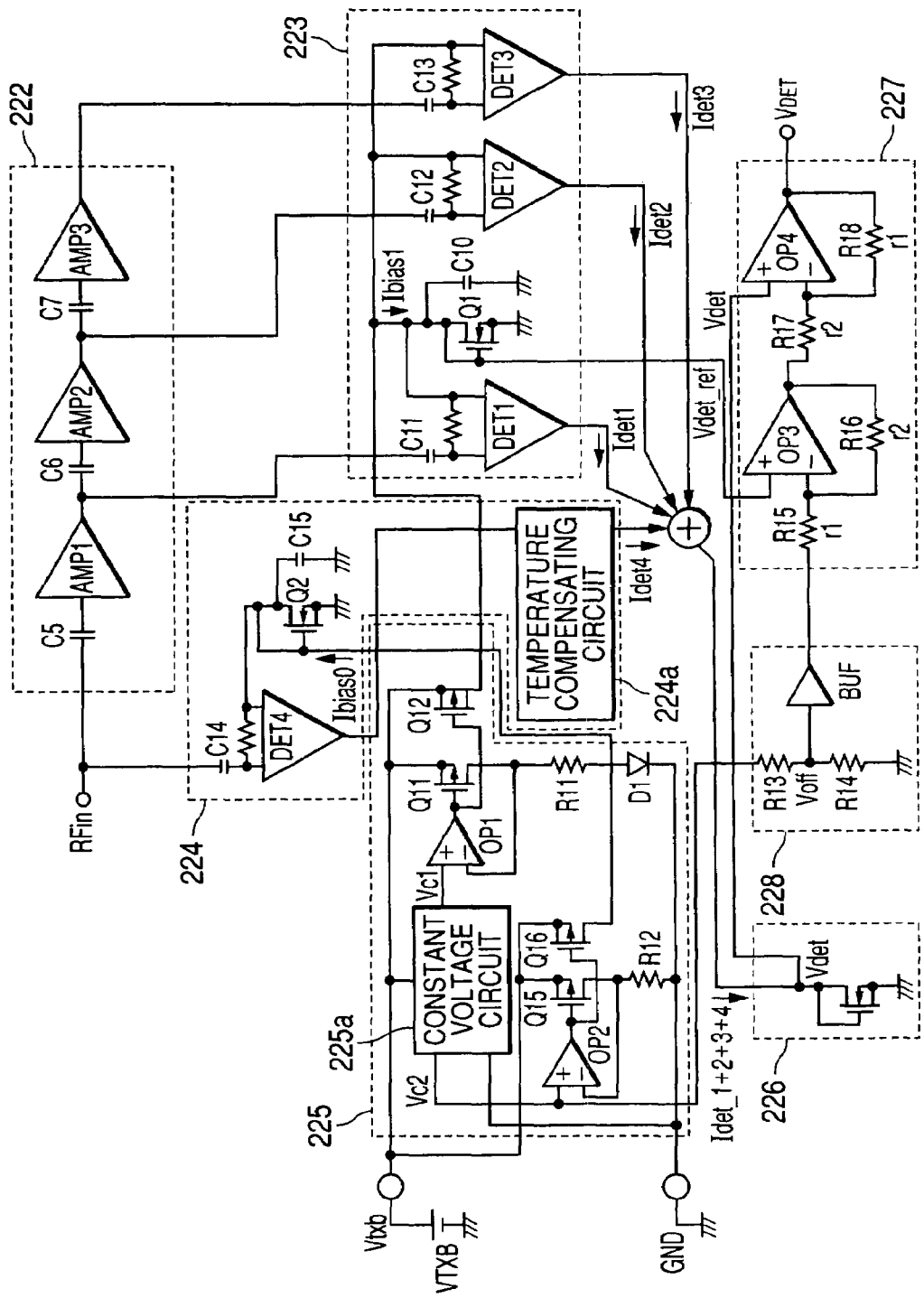
FIG. 2 is a circuit configuration diagram illustrating a first embodiment of an output power detection circuit.
Figure 8:
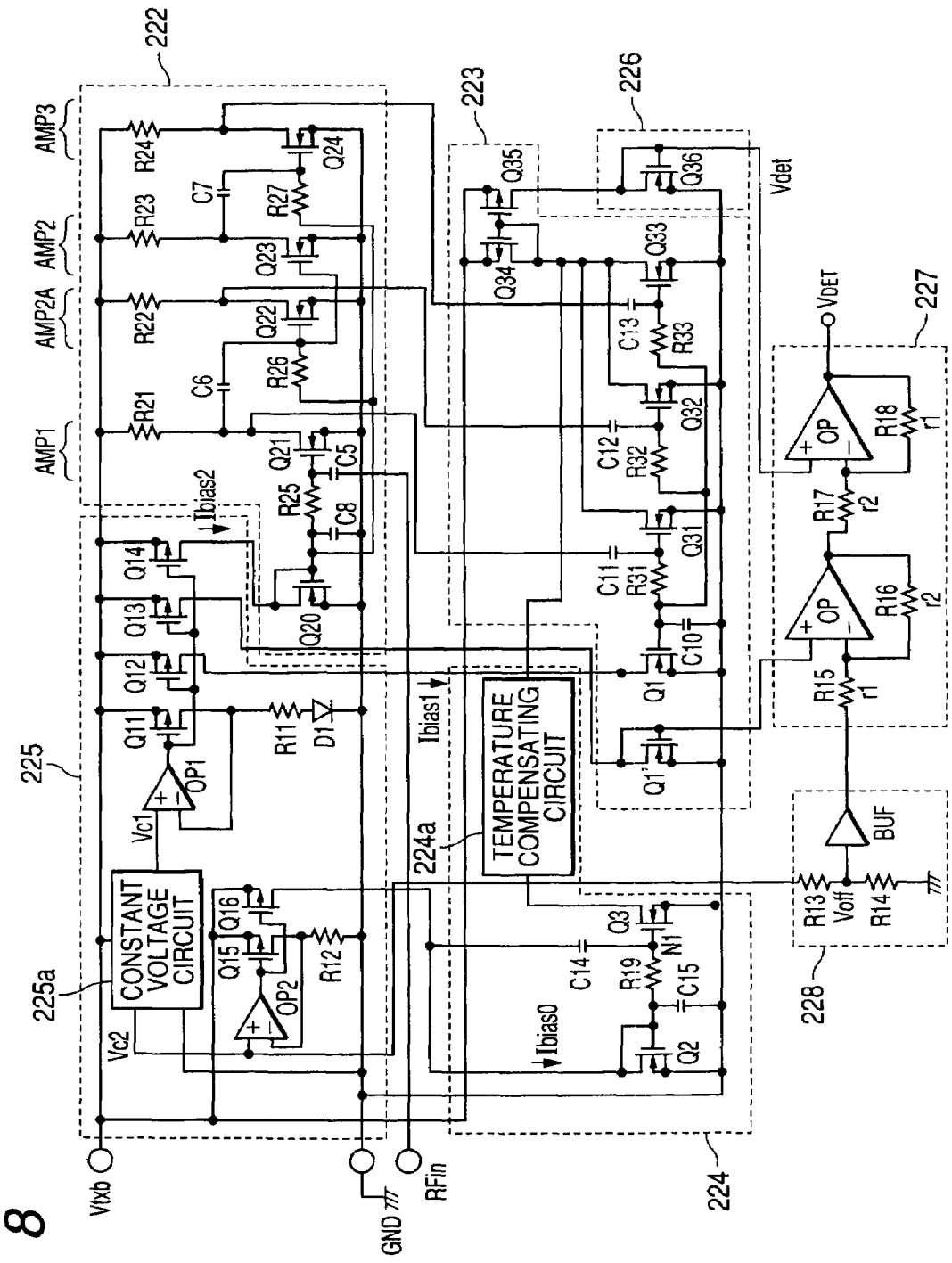
FIG. 8 is a circuit diagram illustrating a circuit example in which the multi-stage configured amplifier circuit, the multi-detection circuit and the RF in-signal detection circuit in the output power detection circuit shown in FIG. 2 are represented at the device level.
Figure 9:
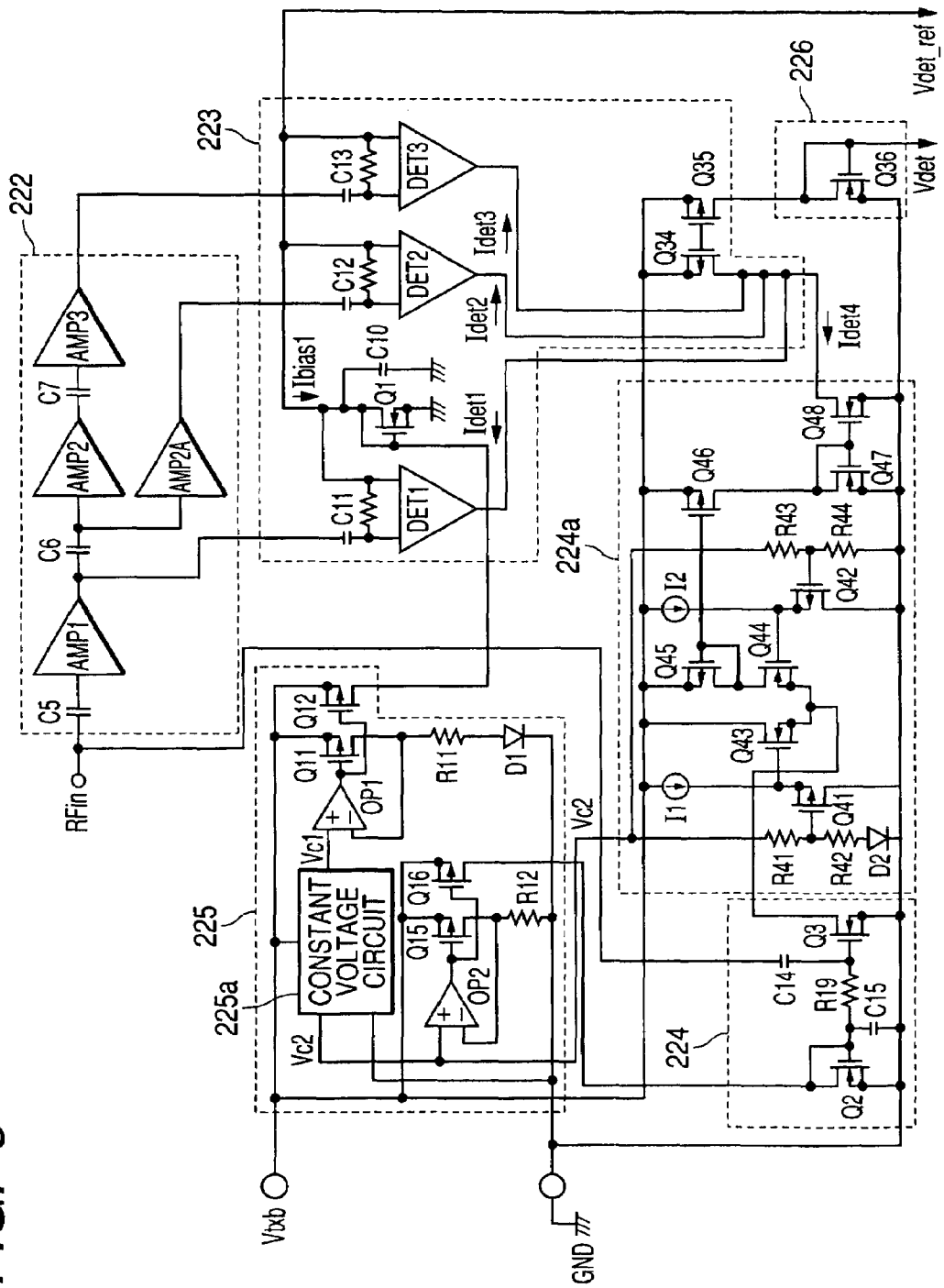
FIG. 9 is a circuit diagram showing a circuit example in which a temperature compensating circuit provided in the RF in-signal detection circuit of the output power detection circuit according to the embodiment is represented at the device level.

A first embodiment of the output power detection circuit 220 is shown in FIG. 2. Incidentally, a signal indicated by a symbol RFin in FIG. 2 is a high frequency signal taken out from the output line of the high frequency power amplifier circuit 210a or 220b by the output extracting means 221a or 221b shown in FIG. 1. In FIG. 2, one (e.g., Q11) in which a symbol indicative of a MOSFET is marked with an outward arrow is a P channel MOSFET, whereas one (e.g., Q2) marked with an inward arrow is an N channel MOSFET (FIGS. 8 and 9 are similar thereto). Unless reference is made in particular, the transistor means MOSFET below.

The output power detection circuit 220 according to the present embodiment includes a multi-stage configured amplifier circuit 222 which amplifies the high frequency signal RFin extracted by the output extracting means 221a or 221b, a multi-detection circuit 223 which detects amplified signals of respective stages of the amplifier circuit 222, and a detection circuit 224 which detects the high frequency signal RFin prior to being amplified by the amplifier circuit 222. The output power detection circuit 220 is provided with a bias current generating circuit 225 which generates a bias current for giving a bias point common to respective stages of the multi-detection circuit 223, and a current-voltage converter circuit 226 which converts a current obtained by combining output currents of the multi-detection circuit 223 and the detection circuit 224 into a voltage. Although the current-voltage converter circuit 226 makes use of a so-called diode-connected transistor whose gate and drain are connected in the present embodiment, a resistive element may be adopted.

Further, the output power detection circuit 220 includes a differential amplifier (subtractor or subtraction circuit) 227 which outputs a voltage corresponding to the difference in potential between the voltage converted by the current-voltage converter circuit 226 and a bias voltage Vdet_ref of each detection stage of the multi-detection circuit 223 as a detection output Vdet, and an offset voltage generating circuit 228 which generates an offset potential Voff to be supplied to the differential amplifier 227 in order to apply an offset voltage to the detection output Vdet.

The multi-stage configured amplifier circuit 222 comprises dc-cut capacitors C5, C6 and C7 and amplifying stages AMP1, AMP2 and AMP3, which are alternately connected in series. The multi-detection circuit 223 comprises three detection stages DET1, DET2 and DET3 provided in a parallel configuration, dc-cut capacitors C11, C12 and C13 provided on the input sides of these detection stages, and a transistor Q1 and a stabilizing capacitor C10 which convert a bias current Ibias1 into a voltage and supply the same bias voltage to the detection stages DET1 through DET3. The bias current Ibias1 is supplied from the bias current generating circuit 225. The transistor Q1 takes a diode connection in which its gate and drain are coupled to each other, and the capacitor C10 is connected between its drain terminal and a ground point.

The output of the amplifying stage AMP1 of the above amplifying stages AMP1 through AMP3 is inputted to the detection stage DET1 via the capacitor C11, the output of the amplifying stage AMP2 is inputted to the detection stage DET2 via the capacitor C12, and the output of the amplifying stage AMP3 is inputted to the detection stage DET3 via the capacitor C13. The gain of the multi-stage configured amplifier circuit 222 is designed so as to be 40 dBm or less in total, preferably 30 dBm or less. Suppressing the gain of the amplifier circuit 222 in this way makes it possible to avoid such a malfunction as to pick up noise and thereby cause oscillations.

The detection circuit 224 comprises a detection stage DET4 having a configuration similar to each of the detection stages DET1 through DET3, a capacitor C14 which cuts a dc component from the input signal, a transistor Q2 and a stabilizing capacitor C15 for converting a bias current Ibias0 to a voltage and supplying a bias voltage to the detection stage DET4, and a temperature compensating circuit 224a. The bias current Ibias0 is supplied from the bias current generating circuit 225. In the present embodiment, output currents Idet1 through Idet4 of the four detection stages DET1 through DET4 are combined together and the combine current is caused to flow into the current-voltage converter circuit 226.

Figure 3:
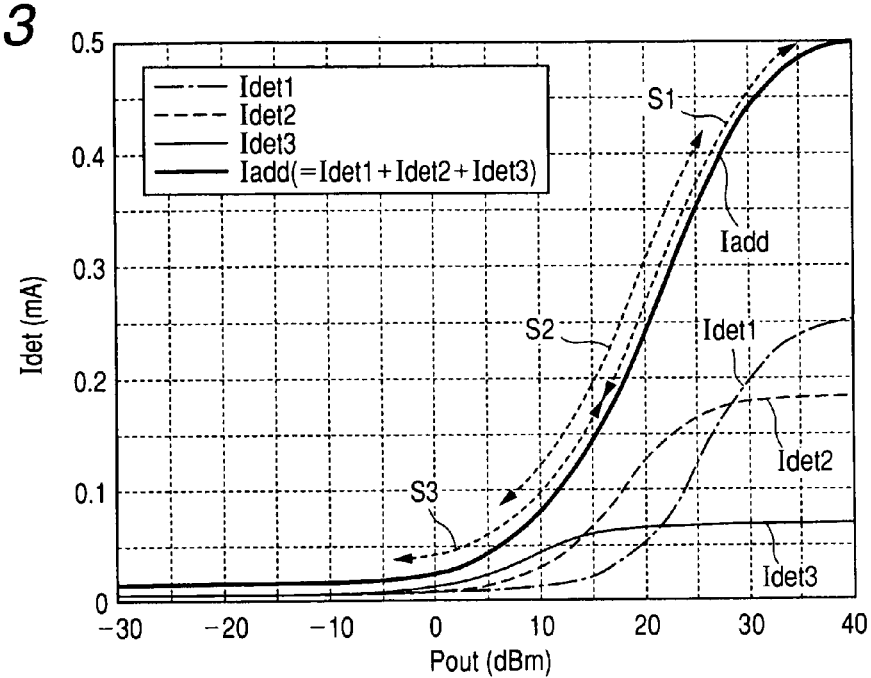
FIG. 3 is a graph depicting the relationship between output power Pout of the RF power module according to the embodiment and detection currents Idet1, Idet2 and Idet3 of a multi-detection circuit.
Figure 4:
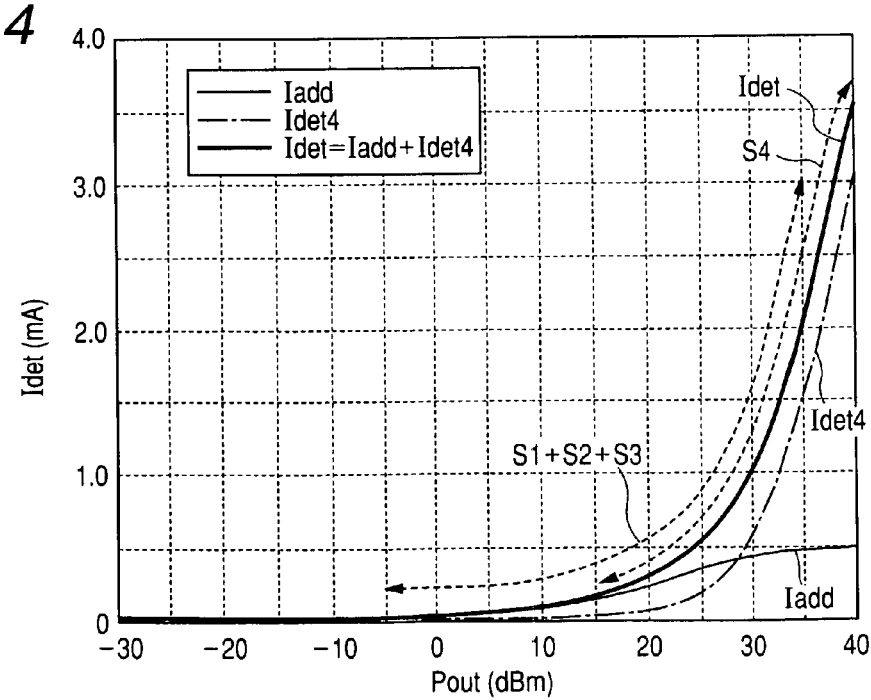
FIG. 4 is a graph illustrating the relationship between output power Pout of the RF power module according to the embodiment, a combined output current Iadd of the multi-detection circuit, an output current Idet4 of an RF in-signal detection circuit and their combined current Idet.

FIG. 3 shows the relationship between output currents Idet1 through Idet3 of the three detection stages DET1 through DET3 of the multi-detection circuit 223 and output power Pout and the relationship between their combined current Iadd (=Idet1+Idet2+Idet3) and output power Pout. FIG. 4 shows the relationship between the combined current Iadd and output power Pout, the relationship between an output current Idet4 of the detection stage DET4 of the detection circuit 224 and output power Pout, and the relationship between their combined detection current Idet (=Idet1+Idet2+Idet3+Idet4) and output power Pout.

In the present embodiment as shown in FIG. 3, the output currents Idet1 through Idet3 of the three detection stages DET1 through DET3 of the multi-detection circuit 223 are designed in such a manner that the output current Idet3 of the detection stage DET3 is first saturated, the output current Idet2 of the detection stage DET2 is then saturated and the output current Idet1 of the detection stage DET1 is finally saturated.

In FIG. 3, the detection stage DET3 defines −5 to 15 dBm of the output power Pout as an effective detection range S3, the detection stage DET2 defines 5 to 25 dBm as an effective detection range S2, and the detection stage DET1 defines 15 to 35 dBm as an effective detection range S1. In FIG. 4, the detection stage DET4 of the detection circuit 224 defines 15 to 40 dBm as an effective detection range S4. Thus, in the present embodiment, the four detection stages DET1 through DET4 are respectively configured so as to share the detection of the different ranges from S1 to S4 while overlapping each other. It is thus possible to detect approximately the full range of the output power Pout with satisfactory sensitivity.

Figure 5A:
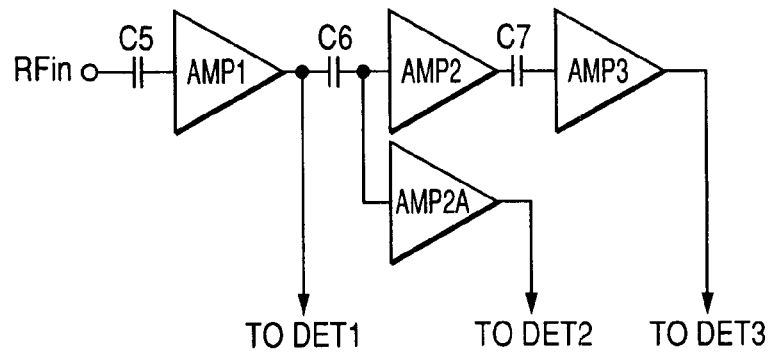
FIGS. 5(A) through 5(C) are respectively circuit configuration diagrams showing modifications of a multi-stage configured amplifier circuit provided prior to the multi-detection circuit.
Figure 5B:
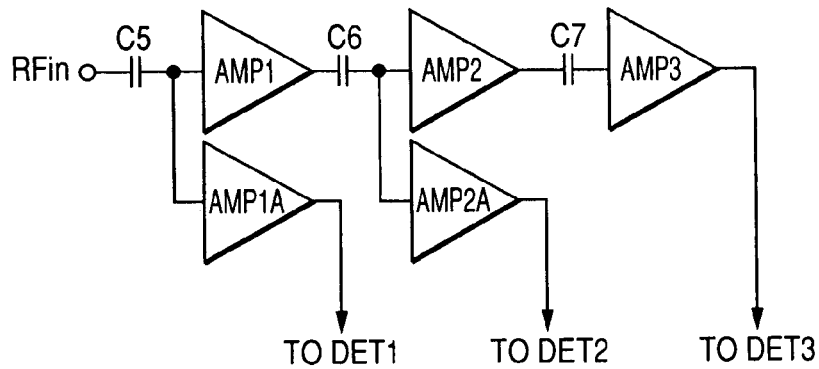
Figure 5C:
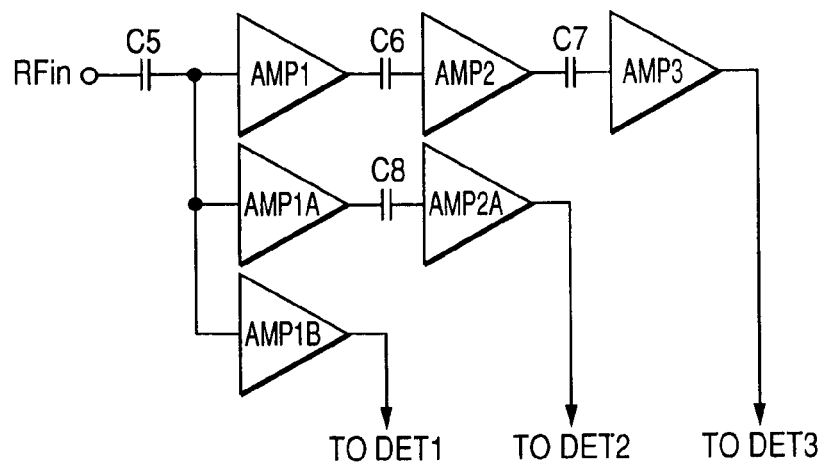

Modifications of the multi-stage configured amplifier circuit 222 are shown in FIGS. 5(A) through 5(C). Of these, FIG. 5(A) illustrates the modification in which an amplifying stage AMP2A which has the same characteristic as the amplifying stage AMP2 and outputs a signal of the same level in response to the same signal is provided in parallel with the amplifying stage AMP2. In the embodiment shown in FIG. 2, the signal inputted to the detection stage DET2 is set as the output of the amplifying stage AMP2. Therefore, the load of the amplifying stage AMP2 is intended for C7 and C17 without being intended for only the capacitor C7, and the frequency characteristic of the output signal of the amplifying stage AMP2 is degraded. However, such frequency-characteristic degradation can be avoided by using the output of the amplifying stage AMP2A for outputting the signal of the same level as the output of the amplifying stage AMP2, as the input of the detection stage DET2.

FIG. 5(B) shows the modification configured in such a manner that a first-stage amplifying stage AMP1 of the multi-stage configured amplifier circuit 222 is also provided with an amplifying stage AMP1A similar to the amplifying stage AMP2A in parallel with the amplifying stage AMP1, and the output of the amplifying stage AMP1A is inputted to the detection stage DET1. FIG. 5(C) shows the modification configured in such a manner that an amplifying stage AMPLB is further provided in parallel with the amplifying stage AMPLA, and the input of the detection stage DET1 and the input of the amplifying stage AMP2A are formed by other amplifiers. Since the high frequency signal RFin corresponding to the input of the final detection stage DET1 is of a signal originally taken out from the output of the final-stage amplifying transistor Qa3 of each high frequency power amplifier circuit high in driving force, it is possible to avoid degradation of the frequency characteristic of the output signal of the amplifying stage AMP1.

Meanwhile, although the degradation of the frequency characteristic of the signal can be suppressed by increasing the number of parallel amplifying stages as shown in FIG. 5, the exclusively-possessed area of the circuit increases to cause an increase in semiconductor chip size. Thus, the number of the parallel amplifying stages may be determined by a trade-off between the frequency characteristic required of the signal and the circuit's exclusively-possessed area. It has been found from the results of simulation executed by the present inventors that in such an RF power module as shown in FIG. 1 which configures the system having such dual modes that the transmit signals of the two systems for GSM and DCS can be power-amplified and outputted, the frequency characteristic required of the signal can be satisfied if the amplifying stage AMP2A is provided in parallel with the amplifying stage AMP2 as shown in FIG. 5(A).

Thus, in the system having the dual modes for GSM and DCS, the adoption of the configuration of FIG. 5(A) having reduced the exclusively-possessed area of the circuit as much as possible is considered to be most suitable for the amplifier circuit 22. On the other hand, if an RF power module employed in such a system that, for example, the transmit signal for only the GSM system can be power-amplified and outputted, is taken, then the detection circuit having the amplifier circuit 222 having no parallel amplifiers such as shown in FIG. 1 can be utilized.

The bias current generating circuit 225 and the differential amplifier 227 shown in FIG. 2 will next be explained. The bias current generating circuit 225 has a constant voltage circuit 225a like a band gap reference circuit which generates a constant voltage free of power supply voltage dependence and temperature dependence, and two op amplifiers (operational amplifiers) OP1 and OP2 which receive constant voltages Vc1 and Vc2 generated by the constant voltage circuit 225a at non-inversion input terminals respectively. Further, the bias current generating circuit 225 includes transistors Q11 and Q12 which receive an output voltage of the operational amplifier OP1 at their gate terminals, and transistors Q15 and Q16 which receive an output voltage of the operational amplifier OP2 at their gate terminals. A resistor R11 and a temperature compensating diode D1 are connected in series with the source side of the transistor Q11. A resistor R12 is connected in series with the source side of the transistor Q15.

A source voltage of the transistor Q11 is fed back to an inversion input terminal of the operational amplifier OP1 to drive the transistor Q11 such that the source voltage of the transistor Q11 coincides with a constant voltage Vc1 outputted from the constant voltage circuit 225a, thereby allowing a predetermined current corresponding to the constant voltage Vc1 to flow into the transistor Q11. A source voltage of the transistor Q15 is fed back to an inversion input terminal of the operational amplifier OP2 to drive the transistor Q15 such that the source voltage thereof coincides with a constant voltage Vc2 outputted from the constant voltage circuit 225a, thereby allowing a predetermined current corresponding to the constant voltage Vc2 to flow into the transistor Q15.

The output voltage of the operational amplifier OP1 is applied to the gate terminal of the transistor Q12 in a manner similar to the transistor Q11 to allow a current proportional to a drain current of the transistor Q11 to flow into the transistor Q12 in accordance with a size ratio between the transistors Q11 and Q12. This is supplied to the transistor Q1 for supplying the bias voltage to the detection stages DET1 through DET3 of the multi-detection circuit 223 as a bias current Ibias1. On the other hand, the output voltage of the operational amplifier OP2 is applied to the gate terminal of the transistor Q16 in a manner similar to the transistor Q15 to allow a current proportional to a drain current of the transistor Q15 to flow in to the transistor Q16 in accordance with a size ratio between the transistors Q15 and Q16. This is supplied to the transistor Q2 for supplying the bias voltage to the detection stage DET4 of the detection circuit 224 as a bias current Ibias0.

The diode D1 is connected in series with the resistor R11 because a positive temperature characteristic is given to the bias current Ibias1 through the use of a negative temperature characteristic of the diode D1 to obtain a constant detection output even though the temperature varies. The temperature compensating diode is not connected in series with the resistor R12 because the multi-detection circuit 223 and the detection circuit 224 differ from each other in the amount of temperature compensation. In the present embodiment, the temperature compensating circuit 224a is provided at a stage subsequent to the detection stage DET4 to compensate for temperature without giving the temperature characteristic to the bias current Ibias0 supplied to the detection circuit 224.

The offset voltage generating circuit 228 comprises series resistors R13 and R14 which resistance-divides the constant voltage Vc2 outputted from the constant voltage circuit 225a, and a buffer amplifier BUF which impedance-converts an offset voltage Voff generated by its division and outputs the same therefrom.

The differential amplifier 227 comprises an operational amplifier OP3 which receives a bias voltage Vdet_ref generated by the multi-detection circuit 223 at its non-inversion input terminal and which is operated so that the offset voltage Voff generated by the offset voltage generating circuit 228 is applied to its inversion input terminal via a resistor R15, and an operational amplifier OP4 which receives the output of the operational amplifier OP3 at its inversion input terminal via a resistor R17. A feedback resistor R16 is connected between an output terminal of the operational amplifier OP3 and the inversion input terminal. It output voltage and a voltage obtained by resistance-dividing the offset voltage Voff by the resistors R15 and R16 are applied to the inversion input terminal of the operational amplifier OP3.

Further, a feedback resistor R18 is connected between an output terminal of the operational amplifier OP4 and its inversion input terminal. Its output voltage and a voltage obtained by resistance-dividing the output of the operational amplifier OP3 by the resistor R17 and a resistor R18 are applied to the inversion input terminal of the operational amplifier OP4.

Incidentally, the input resistor R15 of the operational amplifier OP3 and the feedback resistor R18 of the operational amplifier OP4 are set to the same resistance value, whereas the feedback resistor R16 of the operational amplifier OP3 and the input resistor R17 of the operational amplifier OP4 are set to the same resistance value. The detection voltage Vdet converted by the current-voltage converter circuit 226 is inputted to a non-inversion input terminal of the operational amplifier OP4.

Assuming now that the resistance values of the resistors R15 and R18 are respectively r1, the resistance values of the resistors R16 and R17 are respectively r2, the difference between the input voltages $Vdet_{ref}$ and Vdet of the two amplifiers is $\Delta Vin$ (=Vdet−Vdet_ref), the gain of the entire circuit is Kg, Kg=(r1+r2)/r2 and the output VDET of the circuit is expressed in VDET≈Voff+Kg·$\Delta$Vin. That is, the differential amplifier 227 outputs a voltage proportional to the potential difference between Vdet_ref and Vdet and shifted by Voff as a detection output VDET.

Thus, the output of the differential amplifier 227 results in the detection voltage VDET proportional to an ac component of pure output power that does not contain a dc component based on the bias voltage Vdet_ref. Since the differential amplifier 227 shown in FIG. 2 is capable of easily changing the gain by changing a resistance ratio between the resistors R15 and R18, and R16 and R17, adjustments to the detection sensitivity become easy by using such a differential amplifier. If these resistors are set as external resistors, then the detection sensitivity can also be adjusted after the manufacture of each IC.

The output power detection circuit 220 according to the present embodiment is configured such that the offset voltage Voff is supplied to the operational amplifier OP3 corresponding to a stage prior to the differential amplifier 227 as the dc voltage. When it is desired to set an output level to "0" as the characteristic of the baseband circuit for supplying the output level indication signal Vramp to the error amplifier 234 for controlling the output power, the Vramp signal of 0V might not be outputted at all. This is because there is a fear that when the detection voltage VDET supplied from the output power detection circuit 220 to the error amplifier 234 is 0V in such a case, the control voltage Vapc outputted from the error amplifier 234 becomes higher than 0V, so that the output power Pout is not brought to "0".

Figure 6:
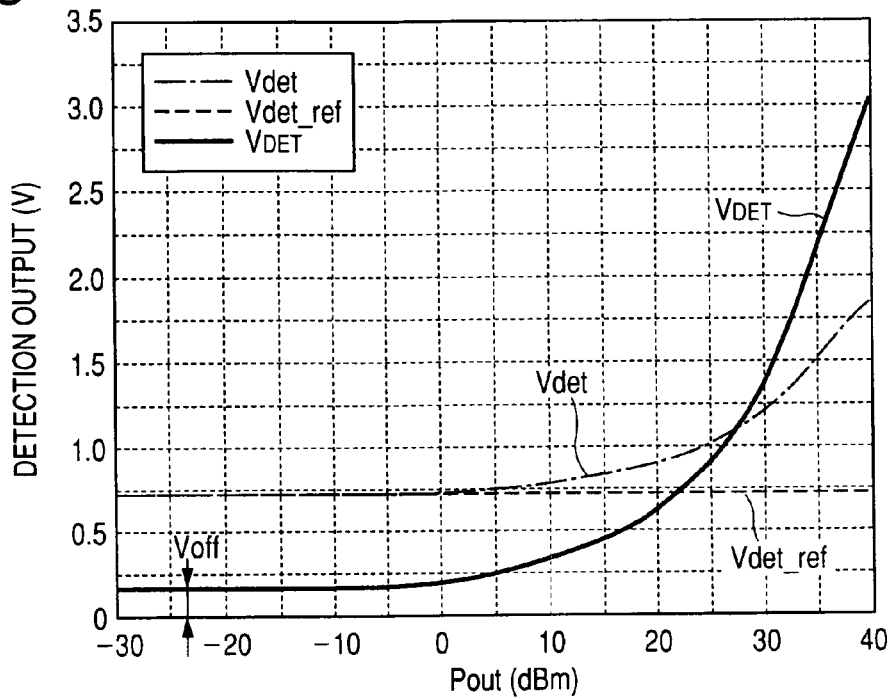

FIG. 6 shows the relationship between the input voltages Vdet_ref and Vdet of the differential amplifier 227, the output voltage VDET thereof, and the output power Pout. The relationship between the detection sensitivity and output power Pout of the output power detection circuit 220 in the system of FIG. 1 using the output power detection circuit 220 according to the present embodiment is shown in FIG. 7 by a solid line.

Figure 7:
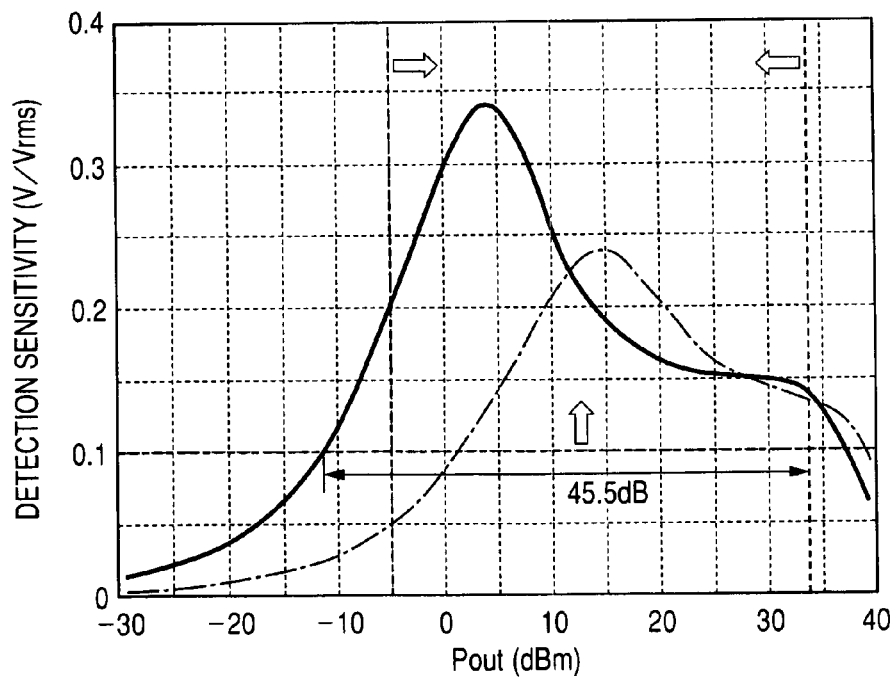
FIG. 7 is a graph showing the relationship between detection sensitivity and output power Pout of an output power detection circuit where the embodiment is applied and unapplied.

For comparison, the relationship between the detection sensitivity and output power Pout where the multi-stage configured amplifier circuit 222 is omitted from the output power detection circuit 220 of FIG. 2, the multi-detection circuit 223 is constituted of one detection stage, and the output of the detection circuit 224 is inputted to the detection stage to thereby configure a two-stage detection circuit is indicated in FIG. 7 by a one-dot chain line. In recent years, a detection sensitivity of 0.1 V/Vrms or more has generally been required in a range of output power Pout from −5 dBm to 33 dBm as indicated by a broken line in FIG. 7 in the GSM system. It is understood from FIG. 7 that the output power detection circuit 220 according to the present embodiment can satisfy this requirement.

A circuit example in which the multi-stage configured amplifier circuit 222, multi-detection circuit 223 and detection circuit 224 in the output power detection circuit 220 shown in FIG. 2 are represented at the device level, is shown in FIG. 8. Incidentally, one shown in FIG. 5(A) is applied as the amplifier circuit 222. In FIG. 8, circuits and elements similar to those shown in FIG. 2 are given the same reference numerals and their dual explanations are omitted.

As shown in FIG. 8, the respective amplifying stages AMP1 through AMP3 of the amplifier circuit 222 are respectively constituted of common-source transistors and their load resistors. That is, the amplifying stage AMP1 comprises a transistor Q21 having a source terminal connected to a ground point and a gate terminal to which a high frequency signal RFin is inputted, and a load resistor R21 connected between its drain terminal and a power supply voltage Vtxb. The amplifying stage AMP2A comprises a transistor Q22 having a source terminal connected to the ground point and a gate terminal to which a drain voltage of the transistor Q21 corresponding to the output of the pre-stage amplifier is inputted, and a load resistor R22 connected between its drain terminal and the power supply voltage Vtxb.

Likewise, the amplifying stage AMP2 comprises a transistor Q23 having a source terminal connected to the ground point and a gate terminal to which the drain voltage of the transistor Q21 corresponding to the output of the pre-stage amplifier is inputted, and a load resistor R23 connected between its drain terminal and the power supply voltage Vtxb. The amplifying stage AMP3 comprises a transistor Q24 having a source terminal connected to the ground point and a gate terminal to which a drain voltage of the transistor Q23 corresponding to the output of the pre-stage amplifier is inputted, and a load resistor R24 connected between its drain terminal and the power supply voltage Vtxb.

Further, the amplifier circuit 222 includes a transistor Q14 which receives the output of an operational amplifier OP1 of the bias current generating circuit 225 at its gate terminal and allows a current proportional to a drain current of a transistor Q11 to flow, and a diode-connected transistor Q20 which converts a bias current Ibias2 supplied from a transistor Q14 into a voltage. The voltage converted by the transistor Q20 is applied to the gate terminals of the amplifying transistors Q21 through Q24 of the amplifying stages AMP1 through AMP3 via resistors R25 through R27, respectively, as a bias voltage for giving an operating point.

The amplifying transistors Q21 through Q24 are constituted of depletion type transistors lower in threshold voltage than enhancement type transistors constituting other circuits. The bias voltage is set to the voltage sufficiently higher than threshold voltage. Therefore, the voltage converted by the transistor Q20 is applied to the gate terminals of the amplifying transistors Q21 through Q24, so that the transistors Q21 through Q24 perform a Class A amplifying operation and is operated so as to output the input signal to the next-stage detection circuit 223 while it remain held as an ac signal.

The next-stage detection circuit 223 has common-source transistors Q31, Q32 and Q33 which receive the outputs of the amplifying stages AMP1, AMP2A and AMP3 of the output power detection circuit 220 at their gate terminals via capacitors C11, C12 and C13, and a P channel transistor Q34 commonly connected to their source terminals in a series configuration. The transistor Q34 takes a diode connection in which its gate and drain are connected to each other, and thereby converts a current obtained by combining drain currents flowing through the transistors Q31, Q32 and Q33 to its corresponding voltage. The transistors Q31, Q32 and Q33 are respectively enhancement type transistors. The voltage converted by the diode-connected transistor Q1 for converting the bias current Ibias1 outputted from the bias current generating circuit 225 to its corresponding voltage is applied to their gate terminals via resistors R31 through R33.

In the present embodiment, the gate bias voltage is set to a voltage value close to the threshold voltage so as to allow each of the transistors Q31, Q32 and Q33 to perform a Class B amplifying operation. Thus, such currents that they are proportional to ac waveforms inputted via the capacitors C11, C12 and C13 and the ac waveforms are half-wave rectified are caused to flow into the transistors Q31, Q32 and Q33. The drain currents of the transistors Q31, Q32 and Q33 are brought to detection currents Idet1, Idet2 and Idet3 each containing a dc component proportional to the amplitude of the input ac signal, and their combined current flows into the transistor Q34.

Further, in the present embodiment, a current Idet4 outputted from the detection circuit 224 is also caused to flow into the transistor Q34. Thus, a current having a magnitude obtained by adding the detection currents Idet1, Idet2, Idet3 and Idet4 flows through the transistor Q34. A transistor Q35 whose gate is commonly-connected to the transistor Q34 is provided and constitutes a current mirror circuit together with the transistor Q34. The current corresponding to a size ratio is caused to flow into the transistor Q35. A drain current of the transistor Q35 is caused to flow into a diode-connected transistor Q36 constituting a current-voltage converter circuit 226 connected in series with the transistor Q35 and converted to its corresponding voltage.

Incidentally, in order to make it easy to more positively saturate the detection stage DET3 rather than the detection stages DET1 and DET2 as described above, a resistor may be provided between the detecting transistor Q33 and the transistor Q34 through which the current of the transfer origin of the current mirror circuit is caused to flow. Resistors are provided between the drains of the detecting transistors Q32 and Q33 and the transistor Q34 respectively, and the value of the resistor on the transistor Q33 side is set larger than the value of the resistor on the transistor Q32 side, whereby the transistor Q33 may be set so as to become easy to saturate.

A description will now be made of temperature compensation where the respective amplifying stages AMP1 through AMP3 of the amplifier circuit 222 and the detection stages DET1 through DET3 of the detection circuit 223 are constituted of common-source transistors as shown in FIG. 8. When the common-source transistors are used, the mutual conductance gm of each of the transistors changes depending upon the temperature and its output varies. It is therefore desirable to perform temperature compensation for gm.

Since the high frequency signal is amplified by the amplifier circuit 222 before its detection by the detection circuit 223 in the output power detection circuit 220 according to the present embodiment, it is necessary to consider even temperature compensation for gm of the amplifier circuit 222 as well as for gm of the detection circuit 223 upon temperature compensation.

In general, a bias current (drain current) Ibias of a common-source FET is expressed in the following equation (1):

$$Ibias = (1/2) * (W/L) * \beta * (VGS - Vth)^2 * (1 + \lambda VDS) \quad (1)$$

In the above equation (1), temperature variation parameters are given as $\beta$ and Vth. Differentiating the equation (1) with a temperature T yields the following equation (2):

$$\delta Ibias / \delta T = \frac{(1/2) * (W/L) * \beta * (VGS - Vth)^2 *}{(1 + \lambda VDS) * \delta B / \delta T} \quad (2)$$

-continued $$= \frac{(W/L) * \beta * (VGS - Vth) *}{(1 + \lambda VDS) * \delta Vth/\delta T}$$

$$= (W/L) * (1 + \lambda VDS) * \left\{ \begin{array}{c} (1/2) * (VGS - Vth)^2 * \delta\beta/\delta T - \\ \beta * (VGS - Vth) * \delta Vth/\delta T \end{array} \right\}$$

Thus, it is necessary to set the temperature characteristic of the bias current so as to satisfy the equation (2) after the condition that the dependence of gm on the temperature is brought to 0 is determined. Therefore, a temperature compensating condition of gm will first be discussed. Since gm is obtained by differentiating the equation (1) with VGM, it is expressed as given by the following equation (3):

$$gm = \delta Ibias/\delta VGS = (W/L)*\beta*(VGS-Vth)*(1+\lambda VDS) \quad (3)$$

Differentiating the equation (3) with a temperature T yields the following equation (4):

$$\delta gm/\delta T = (W/L)*(VGS - Vth)*(1 + \lambda VDS)*\delta\beta/\delta T - \quad (4)$$
$$\beta*(W/L)*(1 + \lambda VDS)*\delta Vth/\delta T$$

$$= (W/L)*(1 + \lambda VDS)* \left\{ \begin{array}{c} (VGS - Vth)* \\ \delta\beta/\delta T - \beta * \delta Vth/\delta T \end{array} \right\}$$

It is understood that the following equation may be established to make δgm/δT=0 from this equation.

$$(VGS-Vth)*\delta\beta/\delta T = \beta*Vth/\delta T \quad (5)$$

Determining the temperature characteristic required for the bias current by substituting the equation (5) into the equation (2) yields the following equation (6):

$$\delta Ibias/\delta T = (W/L)*(1 + \lambda VDS)* \left\{ \begin{array}{c} (1/2)*\beta*(VGS - Vth)* \\ \delta Vth/\delta T - \beta* \\ (VGS - Vth)*\delta Vth/\delta T \end{array} \right\} \quad (6)$$

$$= \frac{-(1/2)*(W/L)*\beta*(VGS - Vth)*}{(1 + \lambda VDS)*\delta Vth/\delta T}$$

$$= -\{Ibias/(VGS - Vth)\}*\delta Vth/\delta T$$

Transforming this equation yields the following equation:

$$(\delta Ibias/Ibias)/\delta T = \{-1/(VGS-Vth)\}*\delta Vth/\delta T \quad (7)$$

Since δVth/δT≈−2mV/degC, VGS−Vth>0 in general, this is substituted into the equation (7) to thereby obtain the following equation:

$$(\delta Ibias/Ibias)/\delta T \approx -2 \text{ mV/degC}/(VGS-Vth) > 0$$

It is thus understood that each of the bias currents Ibias1 and Ibias2 of the amplifier circuit 222 and the detection circuit 223 may be caused to have a positive temperature characteristic.

In the embodiment shown in FIG. 8, a diode D1 connected in series with a resistor R11 in the bias current generating circuit 225 is provided, and a negative temperature characteristic of a forward voltage of the diode is utilized to allow each of the bias currents Ibias1 and Ibias2 to have a positive temperature characteristic. Described specifically, when the temperature rises, the forward voltage of the diode D1 becomes low. Hence, the operational amplifier OP1 increases a current flowing through the resistor R11 to hold constant a drain voltage of a transistor Q11. In doing so, the gate voltage of the transistor Q11 is reduced to increase currents of transistors Q12 and Q13, thus increasing the bias currents Ibias1 and Ibias2 supplied to the amplifier circuit 222 and the detection circuit 223.

On the other hand, the detection circuit 224 for directly detecting the high frequency signal RFin comprises a diode-connected transistor Q2 and a capacitor C15 used for converting a bias current Ibias0 supplied from the bias current generating circuit 225 to its corresponding voltage, a detecting transistor Q3, and a temperature compensating circuit 224a. In the detecting transistor Q3, its source is grounded, the voltage converted by the transistor Q2 is applied to its gate terminal via a resistor R19 as a bias voltage for giving an operating point. On the other hand, the high frequency signal RFin is inputted to the gate terminal of the transistor Q3 via a dc cutting capacitor C14.

The bias voltage applied to the gate terminal of the transistor Q3 is set to the neighborhood of the threshold voltage of the transistor Q3. The transistor Q3 is slightly different in operating point from the transistors Q31 through Q33 of the multi-detection circuit 223 and identical in operation to the transistors Q31 through Q33. The transistor Q3 performs Class B amplification to detect the high frequency signal RFin. A capacitor C15 connected between the gate terminal of the transistor Q2 and its corresponding ground point has the function of preventing that the high frequency signal RFin is round intruded into the gate terminal side of the transistor Q2 to vary its drain current, thereby varying the operating point.

A specific circuit example of the temperature compensating circuit 224a provided in the detection circuit 224 is shown in FIG. 9. The temperature compensating circuit 224a has a differential stage comprising two pairs of series resistors R41 and R42, and R43 and R44 which resistance-divide a constant voltage Vc2 generated by the corresponding constant voltage circuit 225a, transistors Q41 and Q42 which receive the divided voltage at their gates, transistors Q43 and Q44 which receive source voltages of the transistors Q41 and Q42 at their gates, and a load transistor Q45 connected in series with the transistor Q44. The drain of the detecting transistor Q3 of the detection circuit 224 is connected to the source common to the transistors Q43 and Q44 of the differential stage. The current caused to flow through the transistor Q3 by detection of the high frequency signal RFin is distributed into the transistors Q43 and Q44. Of the distributed currents, the current flowing through the transistor Q44 is converted to its corresponding voltage by means of the transistor Q45.

The temperature compensating circuit 224a is provided with a transistor Q46 current mirror-connected to the load transistor Q45, a transistor Q47 connected in series with the transistor Q46, and a transistor Q48 current mirror-connected to the transistor Q47. Thus, the current caused to flow through the transistor Q44 is transferred by the two current mirror transistors Q45 and Q46, and Q47 and Q48 and outputted as a detection current Idet4. In the temperature compensating circuit 224a of the embodiment shown in FIG. 9, the provision of the diode D2 connected in series with the resistor R42 allows the output detection current Idet4 to have a positive temperature characteristic.

Described specifically, assuming that the drain current of the detecting transistor Q3 is equally distributed to the differential transistors Q43 and Q44 at a given temperature. When a chip temperature becomes higher than the given temperature, the forward voltage of the diode D2 becomes low, so that the current flowing through the resistors R41 and R42 increases. In doing so, the gate voltage of the transistor Q41 is lowered to increase the current thereof, and the gate voltage of the transistor Q43 is lowered to decrease the current thereof and increase the current of the transistor Q44, thus resulting in an increase in the output detection current Idet4. When the chip temperature is lowered, the output detection current Idet4 is reduced by operation opposite to the above.

Figure 10:
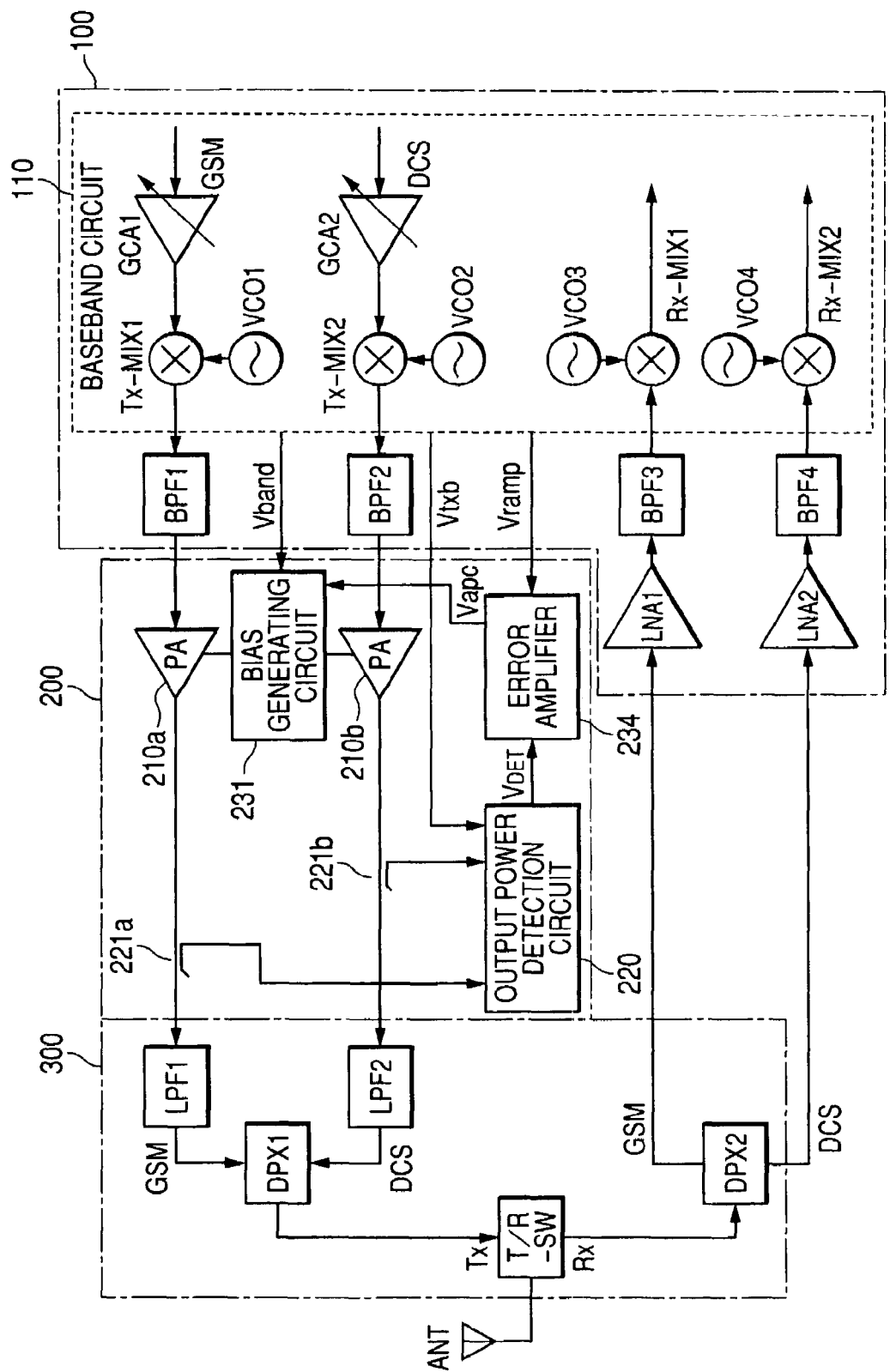
FIG. 10 is a block diagram depicting a schematic configuration of one example of a wireless communication system using the RF power module according to the embodiment.

FIG. 10 shows a schematic configuration of one example of a wireless communication system using the high frequency power amplifying module according to the above embodiment.

In FIG. 10, ANT indicates an antenna for transmitting and receiving a signal wave, and reference numeral 110 indicates a high frequency signal processing circuit (hereinafter called baseband IC) brought into semiconductor integrated circuit form, having a modem circuit capable of performing GMSK modulation/demodulation in systems for GSM and DCS and PSK modulation/demodulation in an EDGE mode. The baseband IC 110 also has a circuit which generates I and Q signals, based on transmit data (baseband signal) and processes the I and Q signals extracted from a receive signal. The baseband IC 110, low-noise amplifiers LNA1 and LAN2 which amplify the receive signal, bandpass filters BPF1 and BPF2 which remove harmonic components from the transmit signal, bandpass filters BFP3 and BPF4 which eliminate unnecessary waves from the receive signal, etc. are mounted or implemented in one package and configured as one electronic part. The low-noise amplifiers LNA1 and LAN2 can also be built in the baseband IC 110.

The baseband IC 110 is provided with mixers Tx-MIX1 and Tx-MIX2 which respectively up-convert transmit signals for GSM and DCS, and mixers Rx-MIX1 and Rx-MIX2 which respectively down-convert receive signals for GSM and DCS. Further, the baseband IC 110 is provided with oscillators VC01 through VC04 which respectively generate oscillation signals mixed with the transmit and receive signals by these mixers, and programmable gain amplifiers GCA1 and GCA2 which respectively amplify the transmit signals for GSM and DCS.

In FIG. 10, reference numeral 200 indicates the RF power module of the above embodiment, including high frequency power amplifier circuits 210a and 210b which amplify high-frequency transmit signals supplied from the baseband IC 110, an output power detection circuit 220, a bias generating circuit 231, an error amplifier 234, etc. Reference numeral 300 indicates a frontend module including filters LPF1 and LPF2 which eliminate noise such as harmonics contained in the transmit signal, duplexers DPX1 and DPX2 which combine the signal for GSM and the signal for DCS together and separate them from each other, a selector switch T/R-SW for transmission/reception, etc.

In the present embodiment as shown in FIG. 10, the baseband IC 110 supplies a mode control signal Vband indicative of either GSM or DCS, an output level indication signal Vramp, and a power supply voltage Vtxb for the output power detection circuit 220 to the RF power module 200. In doing so, the bias generating circuit 231 generates a bias current corresponding to each mode on the basis of the control signal Vband and supplies it to either the high frequency power amplifier circuit 210a or 210b. Feedback control on output power by the output power detection circuit 220, error amplifier 234 and bias generating circuit 231 is performed based on the output level indication signal Vramp.

However, the present invention is not necessarily limited to such a system. For example, there are provided a terminal which outputs a detection voltage VDET of the output power detection circuit 220 to the chip outside, and a terminal which receives a bias voltage of the bias generating circuit 231 from the chip outside. Further, the present invention can also be applied to such a system that the baseband IC 110 corresponding to the stage prior to the high frequency power amplifier circuit 210 performs amplitude control on a high frequency signal outputted according to the output level indication signal Vramp and the detection voltage VDET.

Figure 11:
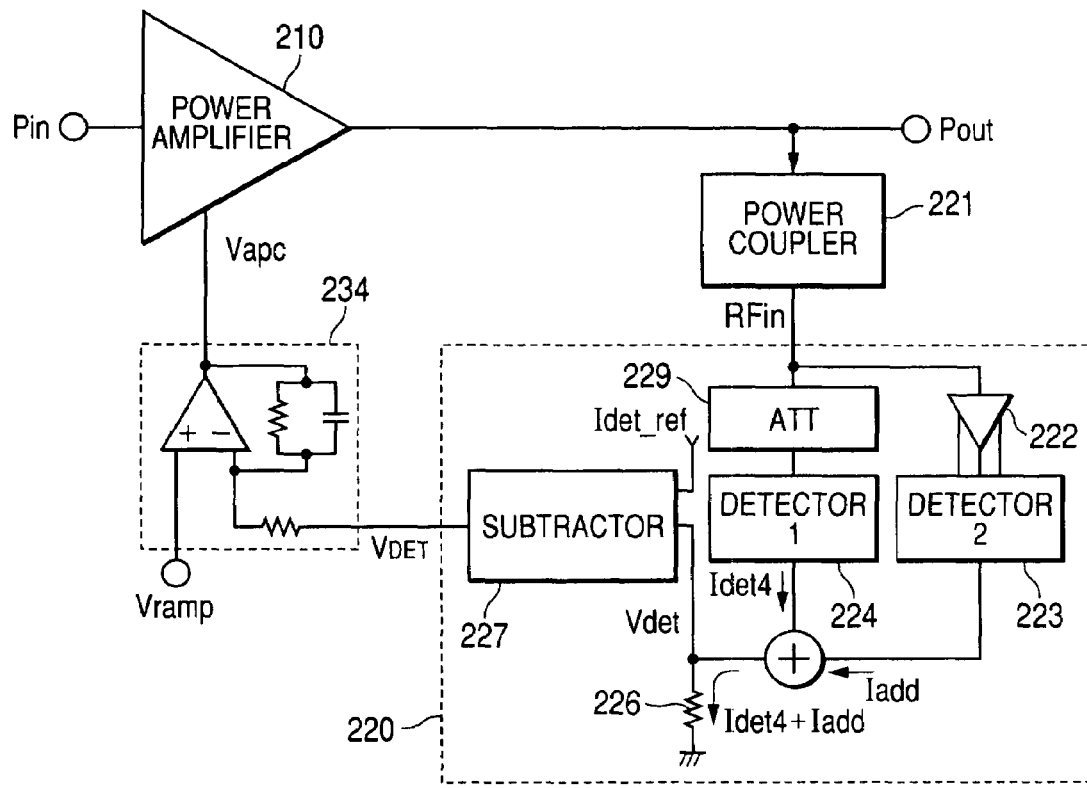
FIG. 11 is a circuit configuration diagram showing a schematic configuration of a second embodiment of an output power detection circuit.

A schematic configuration of a second embodiment of the output power detection circuit 220 is shown in FIG. 11. In FIG. 11, circuits identical to those shown in FIG. 2 and elements identical to those shown in FIG. 2 are given the same reference numerals, and their dual explanations are omitted.

As shown in FIG. 11, the output power detection circuit 220 according to the second embodiment has an attenuator 229 provided on the input side of a first detection circuit 224 which detects without through an amplifier circuit, a high frequency signal RFin taken out from the output of a high frequency power amplifier circuit 210 by a coupler 221 used as a directional power coupler (output extracting means). The second embodiment can be made identical in configuration to the first embodiment except for it.

The reason why the attenuator 229 is provided will be explained here. Assume that when the dynamic ranges of the first detection circuit 224 and the second detection circuit 223 are designed with the coupling loss of the coupler 221 employed in the first embodiment as 20 dB, for example, the shape and size or the like of the coupler 221 used to improve its reflected-wave characteristic or the like vary and the coupling loss is changed to 15 dB, for example. In doing so, there is a fear that the dynamic range of each detection circuit is narrowed if left as it is and hence the output does not reach the maximum power.

Thus, as in the present embodiment, the attenuator 229 is provided on the input side of the detection circuit 224 and set so as to have an attenuation rate of 5 dB. Consequentially, the input of the first detection circuit 224 shown in FIG. 11 is brought to the same level as the first embodiment. Even though the coupler is changed from 20 dB to 15 dB in coupling loss, the output of the first detection circuit 224 becomes the same level as the first embodiment. As a result, it is possible to avoid the narrowing of the dynamic range without changing the gain or the like of the detection circuit.

Incidentally, there is considered a method of inputting the high frequency signal RFin attenuated by the attenuator 229 even to the second detection circuit 223. However, there is a fear that since the second detection circuit 223 is used to detect the high frequency signal RFin in a low power region, detection sensitivity is reduced if done so. Since the high frequency signal RFin attenuated by the attenuator 229 is inputted only to the first detection circuit 224 in the present embodiment, the dynamic range can be expanded without reducing the detection sensitivity in the low power region.

The second detection circuit 223 in the output power detection circuit 220 shown in FIG. 11 comprises a multi-detection circuit having three detection stages in a manner similar to the first embodiment. A multi-stage amplifier circuit 222 that amplifies the high frequency signal RFin taken out by the coupler 221 is provided in a stage prior to the second detection circuit 223. An output current Idet4 of the first detection circuit 224 and an output current Iadd (=Idet1+Idet2+Idet3) of the second detection circuit 223 are combined together, which in turn is caused to flow into a current-voltage converter circuit 226 where it is converted into its corresponding voltage. The converted voltage Vdet is supplied to a differential amplifier (subtractor) 227 from which the voltage corresponding to the difference in potential with respect to a bias voltage Vdet_ref of the second detection circuit 223 is outputted to an error amplifier 234 as a detection output VDET, whereby the gain of a power amplifier 210 is controlled according to an output Vapc of the error amplifier 234. As a result, desired output power control is enabled.

Figure 12:
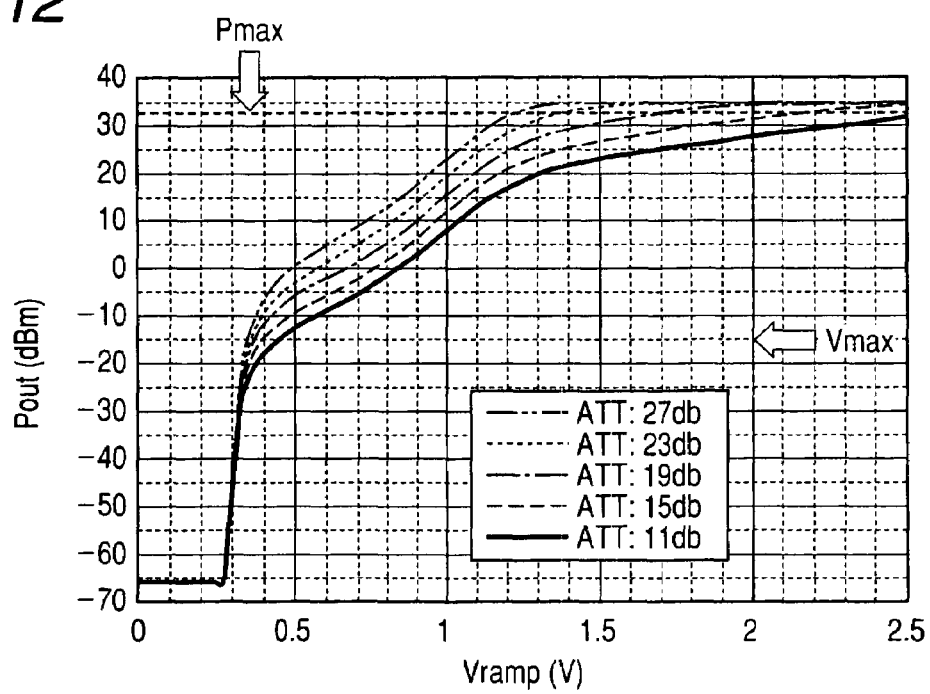
FIG. 12 is a graph illustrating results obtained by changing a coupling loss ATT of a coupler for every 4 dB from 11 dB to 27 dB and determining variations in output power Pout relative to an output control voltage Vramp by simulation in a system using the output power detection circuit according to the first embodiment.

FIG. 12 shows results obtained by changing the coupling loss ATT of the coupler 221 from 11 dB to 27 dB at intervals of 4 dB where the system using the output power detection circuit 220 of the first embodiment, i.e., the circuit in which the attenuator 229 is omitted in FIG. 11 is used, and determining changes in output power Pout with respect to an output control voltage Vramp by simulation. It is understood from FIG. 12 that when the output control voltage Vramp is set to 2V corresponding to the maximum voltage Vmax where the coupling loss ATT of the coupler 221 is 15 dB or less, the output power Pout does not reach 32 dBm corresponding to the maximum output level Pmax.

The output power detection circuit 220 according to the second embodiment is capable of avoiding the occurrence of such a malfunction that the output power Pout does not reach the maximum output level Pmax like, for example, 32 dBm, by adjusting the rate of attenuation of the attenuator 229 since the attenuator 229 is provided, even though the coupling loss ATT changes with a change in the coupler 221.

Figure 13:
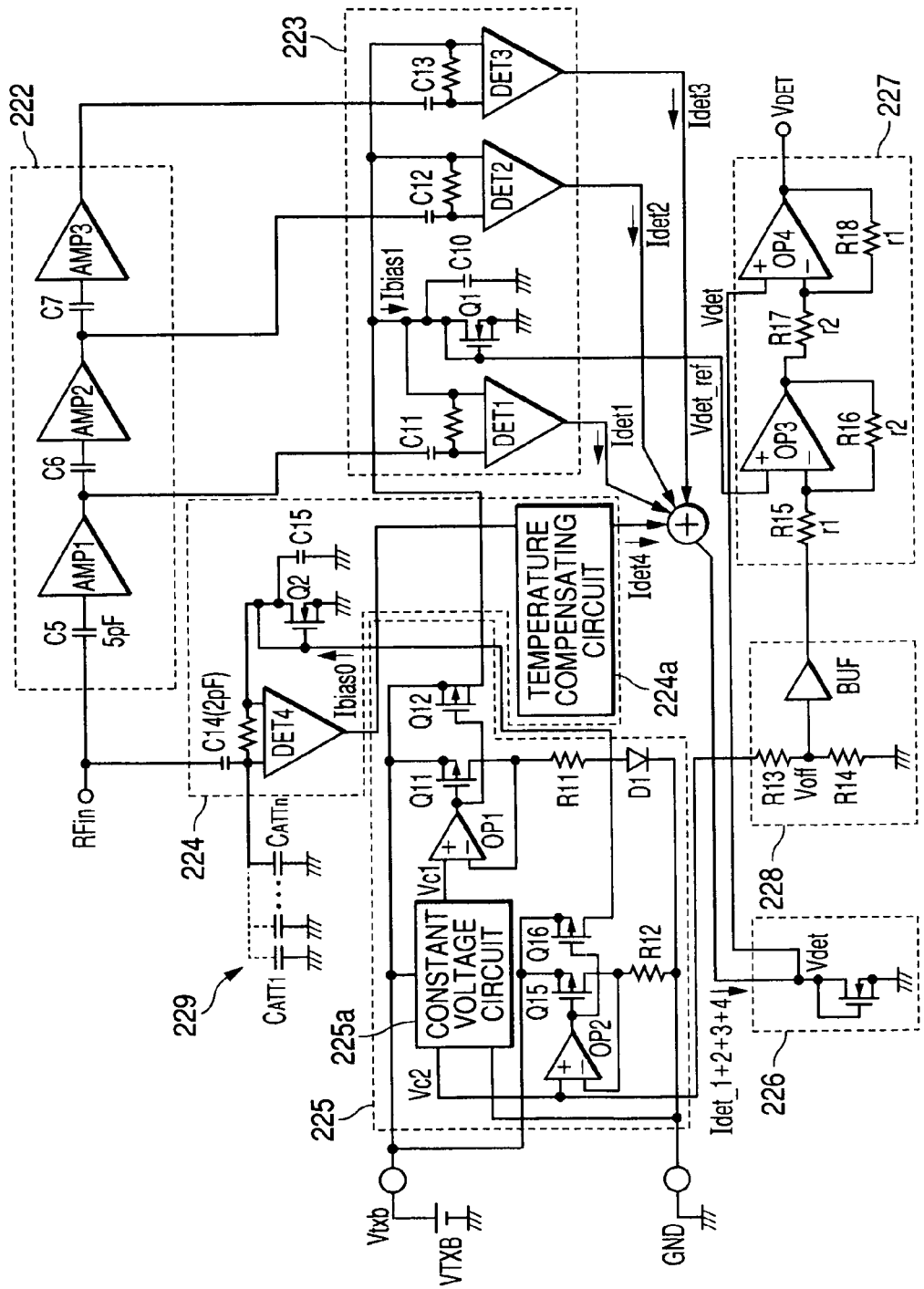
FIG. 13 is a circuit diagram depicting a specific circuit example of the output power detection circuit according to the second embodiment.

A specific circuit example of the output power detection circuit 220 according to the second embodiment is shown in FIG. 13. Incidentally, circuits identical to those shown in FIG. 2 and elements identical to those shown in FIG. 2 are given the same reference numerals in FIG. 13, and their dual explanations are omitted. The elements and circuits shown in FIG. 13 are all formed on a single semiconductor chip like monocrystalline silicon except for a constant voltage source VTXB.

In the circuit shown in FIG. 13, an attenuator 229 is constituted of capacitive elements CATTs connected between an input terminal of a first detection circuit 224 and a ground point. Further, the present embodiment is configured in such a manner that a plurality of capacitive elements CATT1 through CATTn are formed on the semiconductor chip in advance and each element to be connected can be selected according to the presence or absence of the formation of aluminum wiring by master slices. The capacitive elements CATT1 through CATTn may take the same capacitance value respectively or may have capacitance values different from one another. Incidentally, when the first detection circuit 224 has such a circuit configuration as shown in FIG. 8, the attenuation capacitors or capacitances CATTs are connected between a connecting node N1 of the gate terminal of the MOSFET Q3 and the resistor R19 and the ground point.

Figure 14:
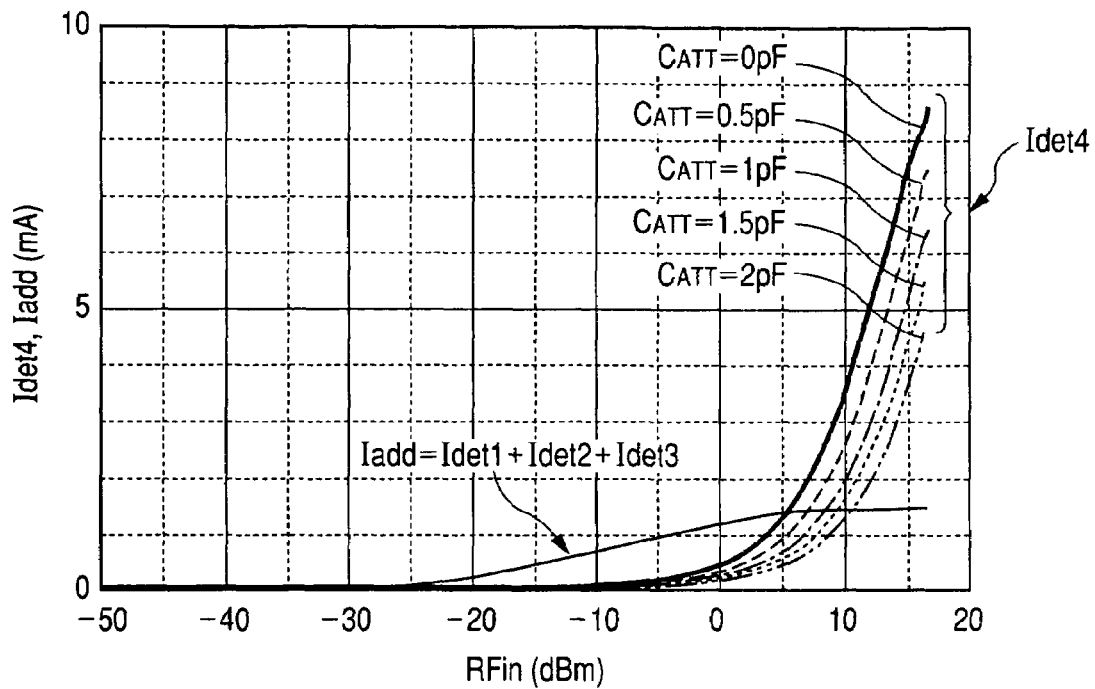
FIG. 14 is a graph showing results obtained by, when 0 pF, 0.5 pF, 1 pF, 1.5 pF and 2 pF are respectively selected as attenuation capacitances CATTs in the circuit of FIG. 13, examining the relationship between the level of an input high frequency signal RFin and detection output currents Idet4 and Iadd (=Idet1+Idet2+Idet3) by simulation.

FIG. 14 shows results obtained by examining by simulation the relationship between the level of an input high frequency signal RFin and detection output currents Idet4 and Iadd (=Idet1+Idet2+Idet3) where, as one example, an input capacitance or capacitor C14 is set to 2 pF and 0 pF, 0.5 pF, 1 pF, 1.5 pF and 2 pF are respectively selected as attenuation capacitances CATTs. It is understood from FIG. 14 that as the attenuation capacitance CATT increases, the detection output current Idet4 decreases. As a matter of course, the detection output current Iadd of the second detection circuit 223 is the same regardless of the magnitude of each CATT.

Figure 15:
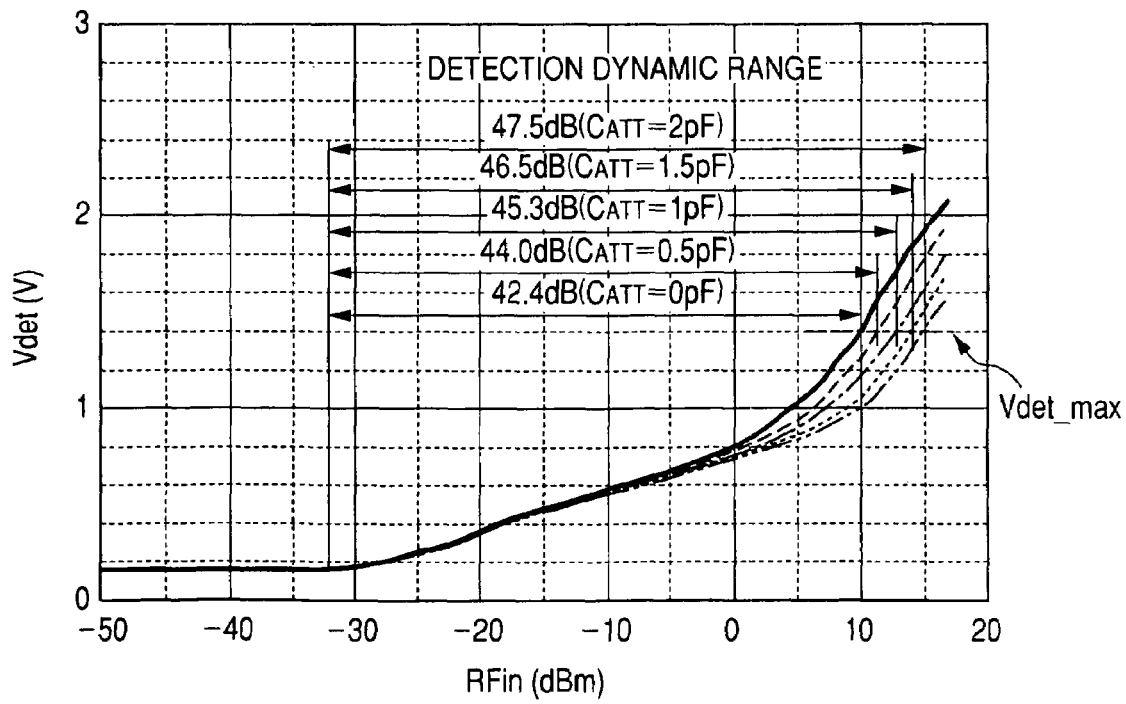
FIG. 15 is a graph showing results obtained by, when 0 pF, 0.5 pF, 1 pF, 1.5 pF and 2 pF are respectively selected as attenuation capacitances CATTs in the circuit of FIG. 13, examining the relationship between the level of an input high frequency signal RFin and output voltages Vdet of the detection circuit by simulation.
Figure 16:
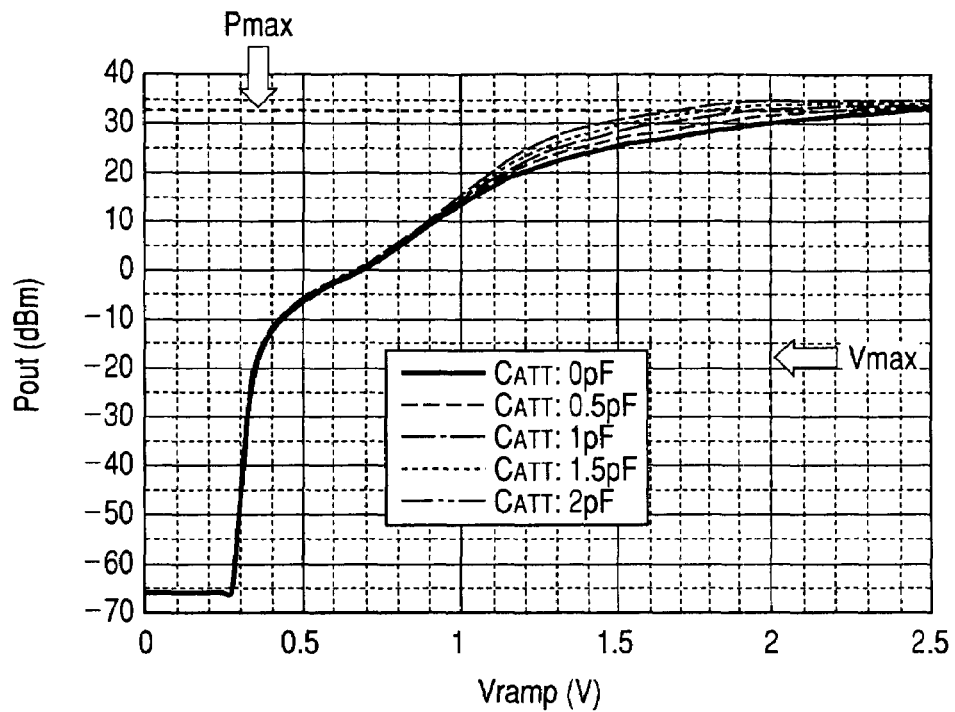
FIG. 16 is a graph showing results obtained by, when one having a coupling loss of 19 dB is used as a coupler and 0 pF, 0.5 pF, 1 pF, 1.5 pF and 2 pF are respectively selected as attenuation capacitances CATTs in the circuit of FIG. 13, examining the relationship between the level of an output control voltage Vramp and output power Pout of a power amplifier by simulation.

FIG. 15 shows results obtained by examining by simulation the relationship between the level of an input high frequency signal RFin and an output voltage Vdet of the detection circuit 220 where 0 pF, 0.5 pF, 1 pF, 1.5 pF and 2 pF are respectively selected as attenuation capacitances CATTs under similar conditions. Further, FIG. 16 shows the relationship between the level of an output control voltage Vramp and output power Pout of the power amplifier 210 where 0 pF, 0.5 pF, 1 pF, 1.5 pF and 2 pF are respectively selected as attenuation capacitances CATTs when one having a coupling loss of 19 dB is used as the coupler 221.

It is understood from FIG. 15 that as the attenuation capacitance CATT increases, the detection output voltage Vdet decreases to increase the level of RFin brought to the maximum detection output voltage Vdet_max, whereby the dynamic range becomes wide. It is understood from FIG. 16 that as the attenuation capacitance CATT increases, the output power Pout relative to the same Vramp becomes higher, and the attenuation capacitance CATT needs to be set to 1 pF or more in order to bring the output power Pout to reach 32 dBm corresponding to the maximum output level Pmax when the output control voltage Vramp is set to 2V corresponding to the maximum voltage Vmax.

Figure 18:
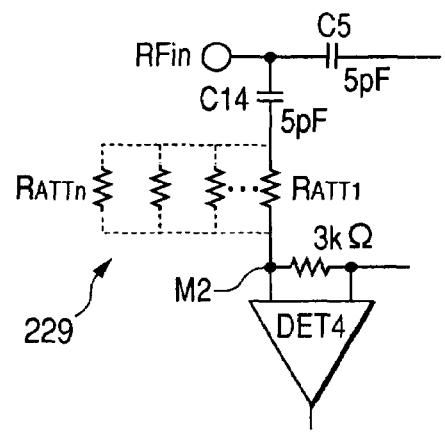
FIG. 18 is a circuit diagram showing a modification of the output power detection circuit according to the second embodiment.

A modification of the output power detection circuit 220 according to the second embodiment is shown in FIG. 18. In the circuit shown in FIG. 18, an attenuator 229 is constituted of resistive elements RATTs series-connected to an input capacitor C14 between an input terminal for an input high frequency signal RFin and an input terminal of a first detection circuit 224. Since the present modification is identical to the embodiment shown in FIG. 13 except for the attenuator 229, the illustration of its detailed circuit will be omitted.

The present embodiment is also configured in such a manner that a plurality of resistive elements RATT1 through RATTn are formed on a semiconductor chip as elements constituting the attenuator 229 in advance, and each element to be connected can be selected according to the presence or absence of aluminum wiring by master slices. The resistive elements RATT1 through RATTn may respectively be resistive elements having the same capacitance value or may be resistive elements having resistance values different from one another.

Further, the resistive elements RATT1 through RATTn connected according to the presence or absence of aluminum wiring by the master slices may be connected between the input terminal of the first detection circuit 224 and the ground point in a manner similar to the capacitive elements shown in FIG. 13 without being connected between the input capacitor C14 and the input terminal of the first detection circuit 224. In such a case, it is desirable to provide a fixed resistor between the input capacitor C14 and the input terminal of the first detection circuit 224.

Figure 17:
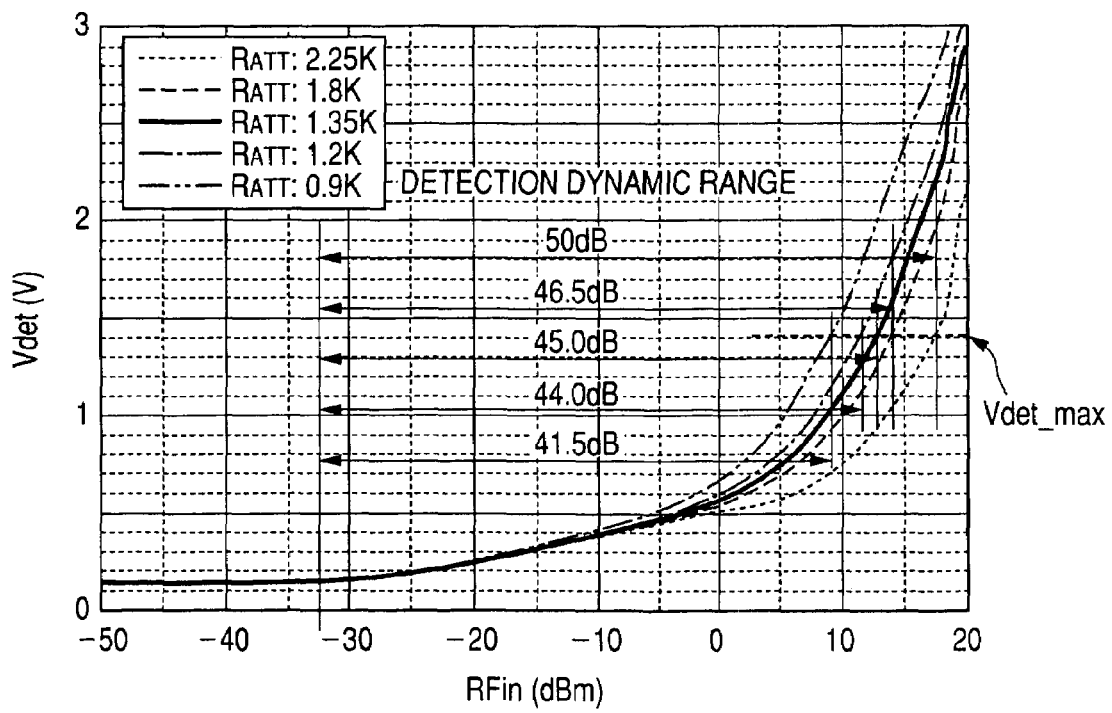
FIG. 17 is a graph showing results obtained by examining by simulation the relationship between the level of an input high frequency signal RFin and an output voltage Vdet of a detection circuit when 2.25 kΩ, 1.8 kΩ, 1.35 kΩ, 1.2 kΩ and 0.9 kΩ are respectively selected as attenuation resistances RATTs in a circuit of FIG. 18.

FIG. 17 shows results obtained by examining by simulation the relationship between the level of an input high frequency signal RFin and an output voltage Vdet of the detection circuit 220 where as one example, the input capacitor C14 is set to 5 pF and 2.25 kΩ2, 1.8 kΩ, 1.35 kΩ, 1.2 kΩ and 0.9 kΩ are respectively selected as attenuation resistors or resistances RATTs. It is understood from FIG. 17 that as the attenuation resistance RATT increases, the detection output voltage Vdet becomes smaller to raise the level of RFin brought to the maximum detection output voltage Vdet_max, whereby the dynamic range is extended.

Incidentally, although the example in which the capacitive elements are used as the attenuator 229 is illustrated in FIG. 13, and the example in which the resistive elements are used as the attenuator 229 is shown in FIG. 18 respectively, it is needless to say that an attenuator utilizing capacitive elements and resistive elements in combination can be used. In the case of the attenuator in which the capacitors and resistors are utilized in combination, the other terminal of each attenuation capacitor or capacitance whose one terminal is connected to a ground point is connected to its corresponding connecting node N2 of the corresponding attenuation resistor RATT and the input terminal of the detection stage DET4 shown in FIG. 18 by means of wiring by the master slice, for example.

Although external elements can also be used as the capacitive elements CATT1 through CATTn or the resistive elements RATT1 through RATTn in terms of the circuit's operation, a disadvantage is brought about in terms of an increase in the number of parts at the time that the external elements are used, and reductions in the size and cost of each device. Thus, the use of on-chipped elements as the attenuation capacitors and the attenuation resistors as in the above embodiment is of extreme importance to a power module that constitutes a cellular phone.

Further, although the capacitive elements CATT1 through CATTn and resistive elements RATT1 through RATTn are selectively connected depending upon the presence or absence of the formation of aluminum wiring by the master slices in the above embodiment, the way of connecting the elements is not limited to the above.

Figure 19:
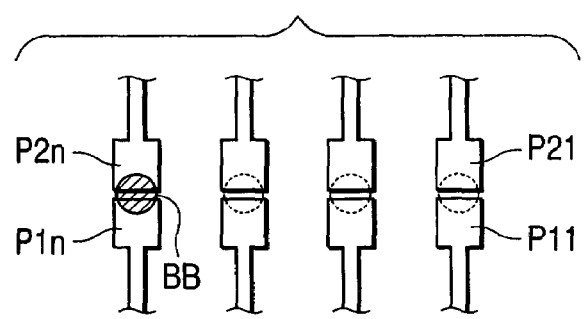
FIG. 19 is an explanatory diagram illustrating another modification of the output power detection circuit according to the second embodiment.

Bonding pads P11 through P1n respectively connected to the capacitive elements CATT1 through CATTn or resistive elements RATT1 through RATTn, and bonging pads P21 through P2n respectively disposed close to these pads and connected to the input terminal of the first detection circuit 224 are provided as illustrated in FIG. 19, for example. The capacitive elements CATT1 through CATTn or resistive elements RATT1 through RATTn may be configured so as to be connected selectively by so-called bonding option in which each bonding ball BB is formed at the boundary between the adjacent two pads to thereby make electrical connections between the pads. However, the connections by the master slices are advantageous for a reduction in chip size.

Figure 20:
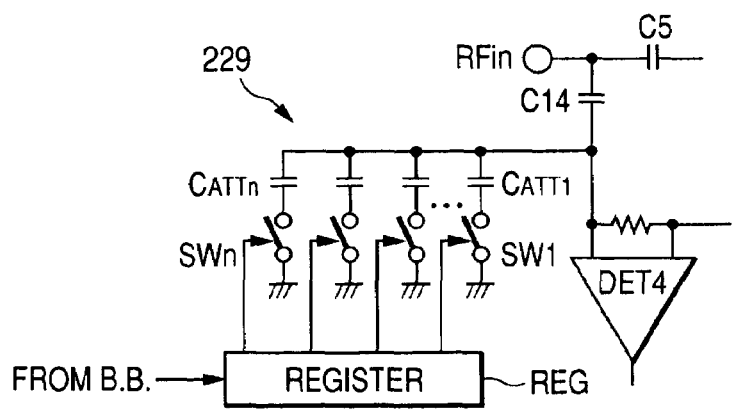
FIG. 20 is a circuit diagram depicting another specific circuit example of the output power detection circuit according to the second embodiment.

Another specific circuit example of the output power detection circuit 220 according to the second embodiment is shown in FIG. 20. The circuit shown in FIG. 20 is provided with switch MOSFET SW1 through SWn series-connected to their corresponding capacitive elements CATT1 through CATTn, and a register REG which holds codes for on/off-controlling these switches, and is configured so as to be capable of selecting the corresponding capacitive element to be connected according to an on or off state of the corresponding switch. Here, general MOSFETs may be used for the switch MOSFET SW1 through SWn, or LDMOSs may be used therefor. As the register REG, may be a volatile one or a non-volatile one.

When the volatile one is used as the register REG, its setting is performed in accordance with instructions issued from the baseband IC described in FIG. 10. As in the RF power module shown in FIG. 1, a module provided with a high frequency power amplifier circuit 210a for GSM and a high frequency power amplifier circuit 210b for DCS and configured such that an output power detection circuit 220 is shared between GSM and DCS, varies in terms of the characteristic of a couple CPL between GSM and DCS. Thus, the changing of attenuation of an attenuator 229 according to a GSM mode or a DCS mode yields an improvement in control characteristic.

Thus, assuming that the attenuator 229 is constituted of the switch MOSFET SW1 through SWn series-connected to the capacitive elements CATT1 through CATTn as shown in FIG. 20, and the capacitive elements connected by the instructions given from the baseband IC are switched to change attenuation, the function of the RF power module can be further enhanced.

Incidentally, the connecting positions of the switch MOSFET SW1 through SWn can also be set between the capacitive elements CATT1 through CATTn and the input terminal of the first detection circuit 224 without being set between the capacitive elements CATT1 through CATTn and the ground point. It is however desirable to potentially set them on the ground-point side. This is similar even where the attenuator 229 is constituted of resistive elements and switch elements without being constituted of the capacitive elements. Further, although the attenuator 229 is provided and the attenuation thereof is changed according to the characteristic of the coupler to be used in the above embodiment, the gain of the first detection circuit 223 may be varied according to the characteristic of the coupler instead of the change in the attenuation of the attenuator 229.

Although the invention made above by the present inventors has been described specifically based on the embodiments, the present invention is not limited to the above embodiments. It is needless to say that various changes can be made thereto within the scope not departing from the gist of the invention. Although LDMOSs are used for the amplifying transistors QA1 through Qa3 and biasing transistors Qb1 through Qb3 of the high frequency power amplifying section in the above embodiment, for example, other transistors may be used such as normal MOSFETs, bipolar transistors, GaAs-MESFETs, heterojunction bipolar transistors (HBT), HEMTs (High Electron Mobility Transistors), etc.

Although the differential amplifier having the two operational amplifiers connected in series is used as the circuit which outputs as the detection voltage VDET, the voltage obtained by subtracting the dc bias voltage Vdet_ref at the detection circuit from the detection voltage Vdet in the above embodiment, a subtractor or subtraction circuit may be used which is configured so as to allow one operational amplifier to input the voltage desired to be computed via an input resistor.

Further, although the three-stage configured amplifier circuit is used as the multi-stage configured amplifier circuit 222 in the above embodiment, the present invention is not limited to it. Alternatively, an amplifier circuit having a two-stage configuration or a configuration of four or more stages may be used. Although the multi-stage configured amplifier circuit 222 is constituted of the common-source type MOSFETs (Q21 through Q24) in the above embodiment, the multi-stage configured amplifier circuit 222 may be constituted of common-emitter bipolar transistors where the amplifying elements of the high frequency power amplifier circuit are made up of bipolar transistors, for example.

While the above description has principally been made of the case in which the invention made above by the present inventors is applied to an RF power module used in a cellular phone which belongs to the field of application reaching the background of the invention, the present invention is not limited to it. The present invention can be applied even to, for example, an RF power module or the like that constitutes a wireless LAN.

What is claimed is:

1. Electronic parts for amplifying high frequency power comprising:
    a high frequency power amplifier which includes amplifying elements and amplifies a transmit signal having a high frequency; and
    an output power detection circuit which detects the magnitude of output power of the high frequency power amplifier,
    said electronic parts for amplifying high frequency power controlling gain of the high frequency power amplifier on the basis of an output of the output power detection circuit and a control signal indicating an output level thereof, wherein the output power detection circuit includes:
- a first detection circuit which detects an ac component extracted from the output of the high frequency power amplifier by a directional power coupler;
- a multi-stage configured amplifier circuit which amplifies the ac component extracted from the output of the high frequency power amplifier by the directional power coupler; and
- a second detection circuit constituted of a plurality of detection stages which detect outputs of respective amplifying stages of the amplifier circuit, and
- wherein the output of the first detection circuit and the output of the second detection circuit are combined together and the combined output is outputted, and an attenuator is provided on the input side of the first detection circuit.

2. The electronic parts for amplifying high frequency power according to claim 1, wherein the attenuator comprises a plurality of capacitive elements or a plurality of resistive elements connectable between the input terminal of the first detection circuit and a constant potential point, and the plurality of capacitive elements or the plurality of resistive elements are on-chipped elements formed in the same semiconductor substrate as a semiconductor substrate formed with the elements that constitute the output power detection circuit.

3. The electronic parts for amplifying high frequency power according to claim 2, wherein the plurality of capacitive elements or the plurality of resistive elements are selectively connected between the input terminal of the first detection circuit and a constant potential point according to the presence or absence of wiring formed by master slices in a wiring forming step.

4. The electronic parts for amplifying high frequency power according to claim 2, wherein the attenuator is provided with a plurality of switch elements connected in series with the plurality of capacitive elements or the plurality of resistive elements, and the plurality of capacitive elements or the plurality of resistive elements are selectively connected between the input terminal of the first detection circuit and a constant potential point according to on/off states of the plurality of switch elements.

5. The electronic parts for amplifying high frequency power according to claim 4, wherein the directional power coupler is a coupling capacitor constituted of a wiring pattern formed over an insulated board with a semiconductor substrate formed with the elements constituting the first detection circuit being mounted thereover.

6. The electronic parts for amplifying high frequency power according to claim 5, further comprising a first high frequency power amplifier circuit which amplifies a transmit signal having a first frequency, a second high frequency power amplifier circuit which amplifies a transmit signal having a second frequency different from the first frequency, a first directional power coupler which takes out an ac component from an output of the first high frequency power amplifier circuit, and a second directional power coupler which takes out an ac component from an output of the second high frequency power amplifier circuit,
- wherein the output power detection circuit is provided as a common circuit which detects the ac component taken out by the first directional power coupler and the ac component taken out by the second directional power coupler, and the attenuator is configured in such a manner that switch elements brought to an on state according to whether the output power detection circuit detects the ac component taken out by either one of the directional power couplers are switched.

7. A wireless communication device comprising:
- electronic parts for amplifying high frequency power defined in claim 4; and
- a baseband circuit which generates a transmit signal to be amplified by the electronic parts for amplifying high frequency power,
- wherein control information indicating whether the plurality of switch elements should respectively be an on state or an off state, is supplied from the baseband circuit to the electronic parts for amplifying high frequency power.

8. The electronic parts for amplifying high frequency power according to claim 1, wherein the attenuator comprises a plurality of parallel-configured resistive elements connectable in series with a capacitive element between an input terminal common to the first detection circuit and the second detection circuit and the input terminal of the first detection circuit, and the plurality of resistive elements are on-chipped elements formed in the same semiconductor substrate as a semiconductor substrate formed with the elements that constitute the output power detection circuit.

* * * * *